United States Patent
Huang et al.

(10) Patent No.: US 8,988,624 B2
(45) Date of Patent: Mar. 24, 2015

(54) DISPLAY PIXEL HAVING OXIDE THIN-FILM TRANSISTOR (TFT) WITH REDUCED LOADING

(75) Inventors: Chun-Yao Huang, Cupertino, CA (US); Young Bae Park, San Jose, CA (US); Shih Chang Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 292 days.

(21) Appl. No.: 13/243,317

(22) Filed: Sep. 23, 2011

(65) Prior Publication Data

US 2012/0327321 A1    Dec. 27, 2012

Related U.S. Application Data

(60) Provisional application No. 61/500,606, filed on Jun. 23, 2011.

(51) Int. Cl.
  *G02F 1/136* (2006.01)
  *G02F 1/1362* (2006.01)
  (Continued)

(52) U.S. Cl.
  CPC ........ *G02F 1/1362* (2013.01); *G02F 1/136286* (2013.01); *H01L 29/7869* (2013.01); *H01L 27/1225* (2013.01); *G02F 2001/13606* (2013.01); *G02F 2201/40* (2013.01)
  USPC .............................................. 349/43; 349/46

(58) Field of Classification Search
  CPC ............ G02F 1/134309; G02F 1/1343; H01L 27/1222; H01L 23/49838
  USPC .............................. 349/42, 43, 46; 257/59, 72
  See application file for complete search history.

(56) References Cited

U.S. PATENT DOCUMENTS 5,811,846 A * 9/1998 Miura et al. ................... 257/291
6,462,800 B1 10/2002 Kim et al.
(Continued)

FOREIGN PATENT DOCUMENTS

EP    804807 B1    7/1999
EP    1933293 A1   6/2008
(Continued)

OTHER PUBLICATIONS

Partial International Search Report and Written Opinion for PCT Application No. US2012/043367 dated Oct. 9, 2012, 5 pgs.
(Continued)

*Primary Examiner* — Edward Glick
*Assistant Examiner* — David Chung
(74) *Attorney, Agent, or Firm* — Fletcher Yoder PC

(57) ABSTRACT

Disclosed embodiments relate to a thin-film transistor (TFT) for use in a display device. The display device may include a liquid crystal display (LCD) panel having multiple pixels arranged in rows and column, with each row corresponding to a gate line and each column corresponding to a source line. Each of the pixels includes a pixel electrode and a TFT. The TFT may include a metal oxide semiconductor channel between a source and drain. For each TFT, holes may be formed in the gate line in a region beneath the source and/or the drain. The holes may be formed such that the source and drain only partially overlap the holes. The presence of the holes reduces the area of the gate line, which may reduce parasitic capacitance and improve loading. This may provide improved panel performance, which may reduce the appearance of certain visual artifacts.

13 Claims, 20 Drawing Sheets

(51) Int. Cl.
*H01L 29/786* (2006.01)
*H01L 27/12* (2006.01)

(56) References Cited

U.S. PATENT DOCUMENTS

| | | |
|---|---|---|
| 6,921,917 B2 | 7/2005 | Choi et al. |
| 6,995,048 B2 | 2/2006 | Yoneda et al. |
| 7,023,501 B2 | 4/2006 | Ahn et al. |
| 7,427,777 B2 * | 9/2008 | Tsou et al. ............ 257/59 |
| 7,522,226 B2 | 4/2009 | Park et al. |
| 7,683,913 B2 | 3/2010 | Koyama et al. |
| 2002/0044120 A1 | 4/2002 | Watanabe et al. |
| 2002/0084459 A1 * | 7/2002 | Choi et al. ............ 257/72 |
| 2002/0127354 A1 | 9/2002 | Kobayashi et al. |
| 2005/0052602 A1 | 3/2005 | Liu |
| 2007/0229723 A1 | 10/2007 | Huang |
| 2008/0180613 A1 | 7/2008 | Matsumoto |
| 2010/0134396 A1 * | 6/2010 | Umezaki ............ 345/92 |
| 2011/0255045 A1 * | 10/2011 | Son et al. ............ 349/139 |

FOREIGN PATENT DOCUMENTS

| | | |
|---|---|---|
| JP | 2010021170 A | 1/2010 |
| KR | 10-2007-00972383 A | 10/2007 |
| WO | 9823997 A1 | 6/1998 |

OTHER PUBLICATIONS

International Search Report and Written Opinion for PCT No. PCT/US2012/043367 dated Sep. 27, 2013; 18 pgs.
Korean Notice of Preliminary Rejection for Korean Application No. 10-2012-67658 dated Oct. 21, 2013; 4 pgs.
Taiwanese Office Action for Taiwan Application No. 101122526 dated Jun. 13, 2014; 6 pgs.

* cited by examiner

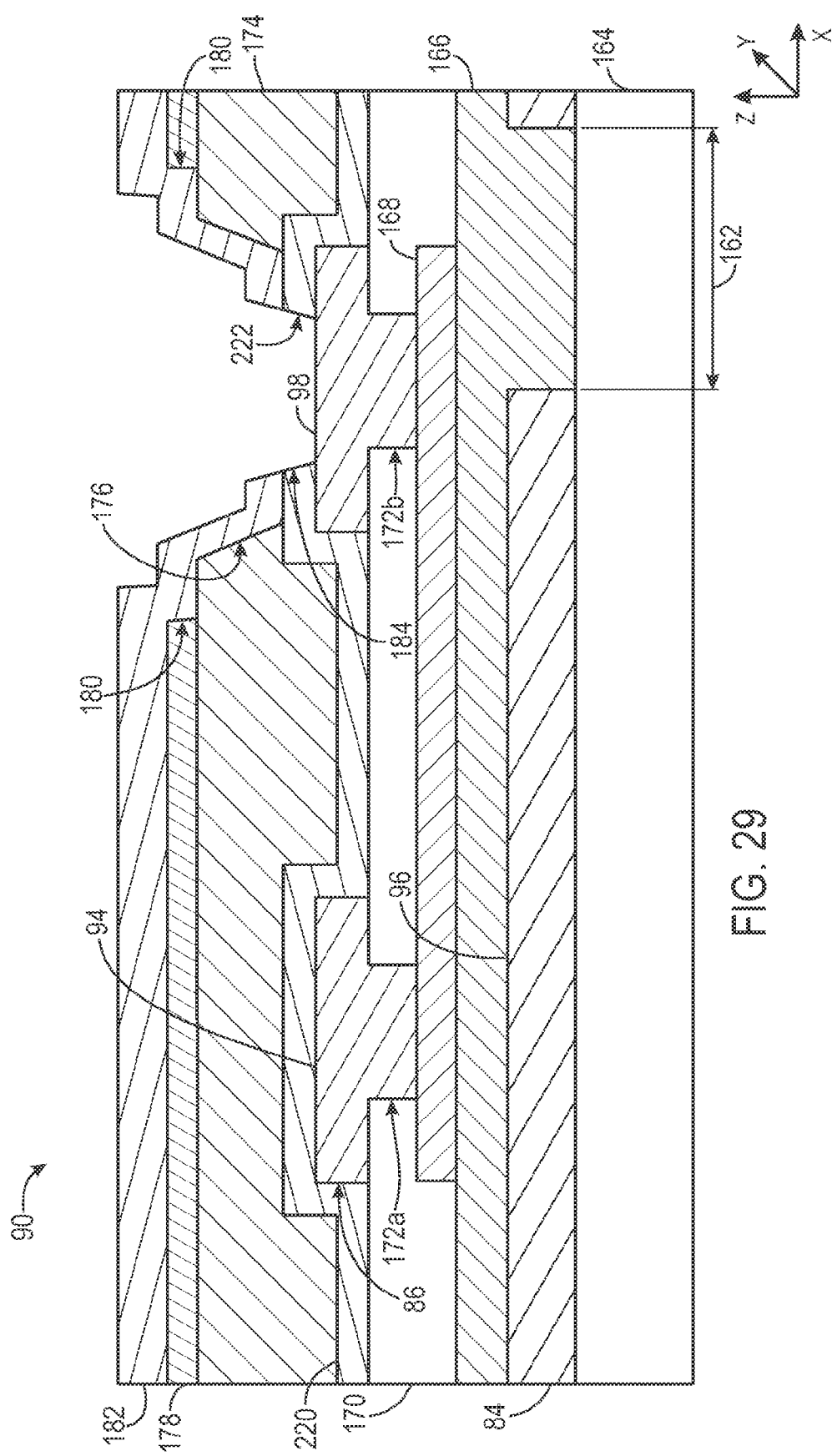

DISPLAY PIXEL HAVING OXIDE THIN-FILM TRANSISTOR (TFT) WITH REDUCED LOADING

BACKGROUND

The present disclosure relates generally to liquid crystal displays (LCDs) and, more specifically, to oxide thin-film transistors (TFT) that may be used to form pixels of such LCDs.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Flat panel displays, such as liquid crystal displays (LCDs), are commonly used in a wide variety of electronic devices, including such consumer electronics as televisions, computers, and handheld devices (e.g., cellular telephones, audio and video players, gaming systems, and so forth). Such display panels typically provide a flat display in a relatively thin package that is suitable for use in a variety of electronic goods. In addition, such devices typically use less power than comparable display technologies, making them suitable for use in battery-powered devices or in other contexts where it is desirable to minimize power usage.

LCD devices typically include picture elements (image pixels) arranged in a matrix to display an image that may be perceived by a user. The matrix, sometimes called an array, includes rows and columns of thin-film-transistors (TFTs) arranged adjacent to a layer of liquid crystal material, wherein the each TFT represents an image pixels. Individual pixels of an LCD device may variably permit light to pass when an electric field is applied to a liquid crystal material in each pixel, which may be generated based upon a voltage difference between a pixel electrode and a common electrode. The TFT of the pixel passes the voltage difference onto a pixel electrode when an activation voltage is applied to its gate and a data signal voltage is applied to its source. By controlling the amount of light that may be emitted from each pixel, the LCD, in conjunction with a color filter array, may cause a viewable color image to be displayed.

However, a parasitic capacitance between the gate line supplying a gate activate voltage and other components of the pixel may result in the occurrence of certain visual artifacts, such as image sticking (e.g., parasitic capacitance between the gate line and the pixel electrode and/or drain of the TFT) and/or green tinting (e.g., DC voltage coupling effect between gate activation signal and the liquid crystal material and/or polyimide materials used for liquid crystal alignment. Such visual artifacts may reduce the accuracy of the display. Additionally, in some LCD devices, certain properties of the TFTs cause large RC loading in the gate lines and/or common electrodes. This may reduce TFT switching performance, which may also cause visual artifacts. These problems may become more pronounced as LCDs increase in resolution, with the pixels becoming more densely-packed.

Further, in existing LCDs, TFTs may include an active layer that is typically fabricated using silicon-based materials, such as amorphous silicon (a-Si), poly-silicon (poly-Si), or microcrystalline silicon. Such silicon-based materials typically have a scaling limit, meaning that once they are scaled down to a certain size, they generally cannot be reduced any further in size without affecting operation. Additionally, the dimensions of an opaque black mask portion of a color filter array are generally selected so that the TFTs, gate lines, and source lines are covered by the black mask when viewed from the front side of the LCD. Thus, since light emitted from a backlight of the LCD device cannot transmit through the black mask, the overall transmittance of the LCD is at least partially limited by the dimensions of the black mask, which, in turn, is limited by the size of the TFTs, gate lines, and data lines.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The embodiments described below relate generally to a thin-film transistor (TFT) for use in a display device. For example, the display device may include a liquid crystal display (LCD) panel having multiple pixels arranged in rows and column, with each row corresponding to a gate line and each column corresponding to a source line. Each of the pixels includes a pixel electrode and a TFT. The TFT may include a metal oxide semiconductor active layer between a source and drain. For each TFT, holes may be formed in the corresponding gate line in regions beneath the source and/or the drain. The holes may be formed such that the source and drain only partially overlap the holes. The presence of the holes reduces the area of the gate line within these regions, which may reduce parasitic capacitance and improve RC loading. This may provide improved panel performance, which may reduce the appearance of certain visual artifacts, such as image sticking, green tinting, and so forth, while improving color accuracy.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which:

FIG. 29 shows a further embodiment of the metal oxide TFT that includes organic and inorganic passivation layers over the source and drain.

DETAILED DESCRIPTION OF SPECIFIC EMBODIMENTS

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. The embodiments discussed below are intended to be examples that are illustrative in nature and should not be construed to mean that the specific embodiments described herein are necessarily preferential in nature. Additionally, it should be understood that references to "one embodiment," "an embodiment," "some embodiments," and the like are not intended to be interpreted as excluding the existence of additional embodiments that also incorporate the disclosed features.

Figure 1:
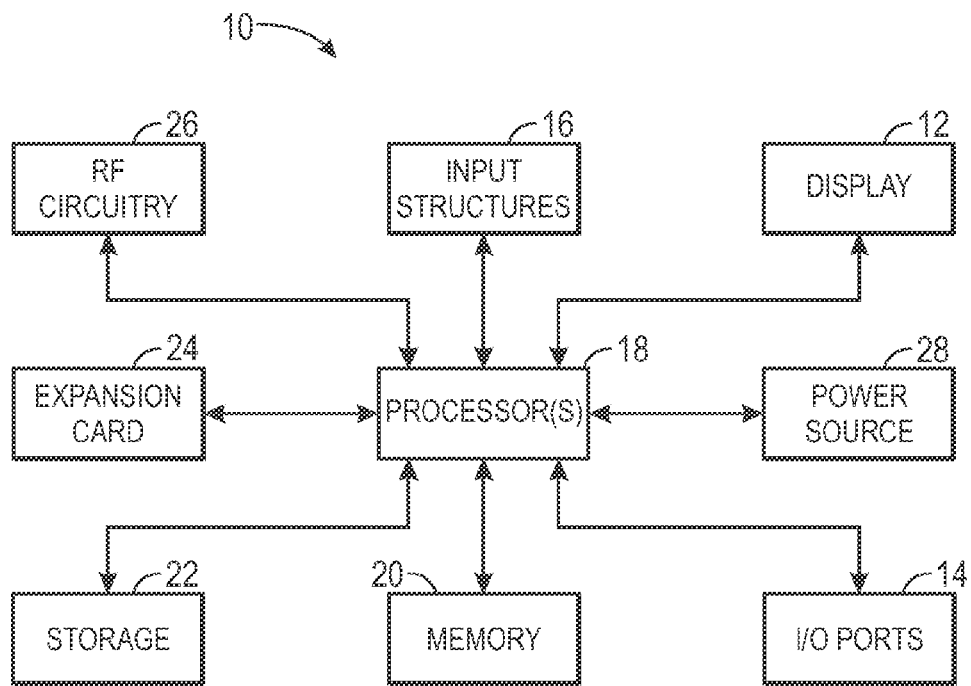
FIG. 1 is a simplified block diagram depicting components of an example of an electronic device having an LCD that includes metal oxide-based thin-film transistors (TFTs), in accordance with aspects set forth in the present disclosure.

FIG. 1 provides a block diagram illustrating an example of an electronic device 10 having a display 12. The display 12 may include a liquid crystal display (LCD) having pixels that include thin-film transistors (TFT) having an active layer formed from a metal oxide semiconductor material (referred to herein as "metal oxide TFT"), in accordance with aspects of the present disclosure. As will be discussed in further detail below, an LCD utilizing such metal oxide TFTs may exhibit improved image quality with a reduction in visual artifacts due at least in part to reduced RC loading and decreased parasitic capacitance, and may also be configured to have increased transmittance when compared to certain conventional LCDs, such as LCDs utilizing TFTs with silicon-based active layers.

The electronic device 10 may be any type of electronic device that includes the display 12, such as a laptop or desktop computer, a mobile phone, a digital media player, or the like. The functional blocks depicted in FIG. 1 may include hardware elements (e.g., circuitry), software elements (e.g., computer code stored on computer-readable media, such as a hard drive or system memory), or a combination of both hardware and software elements. It should be noted that FIG. 1 is merely one example of a particular implementation and is intended to illustrate the types of components that may be present in such a device. For example, in the illustrated embodiment, these components may include the display 12 referenced above, as well as input/output (I/O) ports 14, input structures 16, one or more processors 18, memory device(s) 20, non-volatile storage 22, expansion card(s) 24, RF circuitry 26, and power source 28.

As discussed above, the display 12 may include an LCD and may display various images generated by the electronic device 10. For example, the display 12 may be an LCD employing fringe-field switching (FFS), in-plane switching (IPS) or other techniques used in operating such LCD devices. The display 12 may be a color display utilizing multiple color channels, such as red, green, and blue color channels, for generating color images. As discussed further below, the display 12 in the form of an LCD may include a panel having an array of metal oxide TFTs, which may be configured to reduce visual artifacts by providing reduced RC loading and parasitic capacitance, thus improving overall image quality. In one embodiment, the display may be a high-resolution LCD display having 300 or more pixels per inch, such as a Retina Display®, available from Apple Inc. of Cupertino, Calif. Moreover, in some embodiments, the display 12 may be provided in conjunction with a touch-sensitive element, such as a touch screen, that may function as one of the input structures 16 for the electronic device 10. For instance, the touch screen may sense inputs based on contact with a user's finger or with a stylus.

The processor(s) 18 may control the general operation of the device 10. For instance, the processor(s) 18 may provide the processing capability to execute an operating system, programs, user and application interfaces, and any other functions of the device 10. The processor(s) 18 may include one or more microprocessors, such as one or more general-purpose microprocessors, application-specific microprocessors (ASICs), or a combination of such processing components. For example, the processor(s) 18 may include one or more processors based upon x86 or RISC instruction set architectures, as well as dedicated graphics processors (GPU), image signal processors, video processors, audio processors and/or related chip sets. By way of example only, the processor(s) 18 may include a model of a system-on-a-chip (SoC) processor available from Apple Inc., such as a model of the A4 or A5 processors.

The instructions or data to be processed by the processor(s) 18 may be stored in a computer-readable medium, such as a memory device 20. The memory device 20 may be provided as volatile memory, such as random access memory (RAM), or as non-volatile memory, such as read-only memory (ROM), or as a combination of RAM and ROM devices. The memory 20 may store a variety of information and may be used for various purposes. For example, the memory 18 may store firmware for the device 10, such as a basic input/output system (BIOS), an operating system, various programs, applications, or any other routines that may be executed on the device 10, including user interface functions, processor functions, and so forth.

The device 10 may also include a non-volatile storage 22 for persistent storage of data and/or instructions. For instance, the non-volatile storage 20 may include flash memory, a hard drive, or any other optical, magnetic, and/or solid-state storage media, or some combination thereof. Thus, while depicted as a single device in FIG. 1 for clarity, the non-volatile storage 22 may include a combination of one or more of storage devices operating in conjunction with the processor(s) 18. The non-volatile storage 22 may be used to store firmware, data files, image data, software programs and applications, and any other suitable data. For instance, the non-volatile storage 22 may store image data that may be displayed as a viewable image using the display 12. Further, the RF circuitry 26 may enable the device 10 to connect to a network, such as a local area network, a wireless network (e.g., an 802.11x network or Bluetooth network), or a mobile network (e.g., EDGE, 3G, 4G, LTE, WiMax, etc.), and to communicate with other devices over the network.

Figure 2:
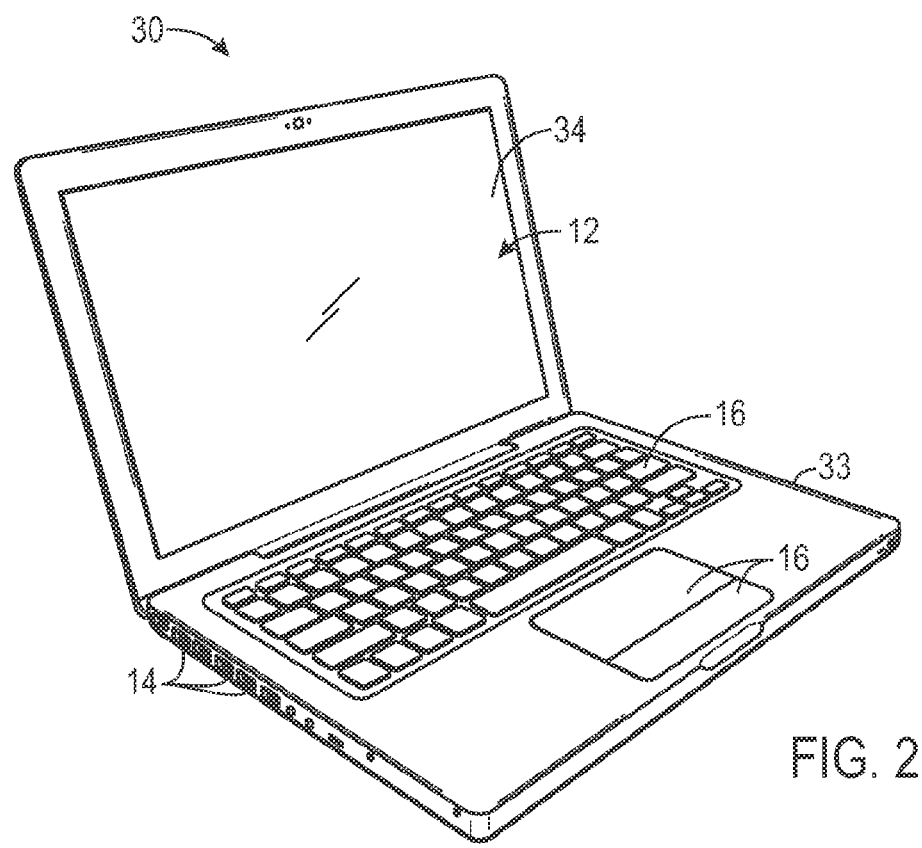
FIG. 2 shows the electronic device of FIG. 1 in the form of a computer.

FIG. 2 illustrates an embodiment of the electronic device 10 in the form of a computer 30. The computer 30 may portable computers (such as laptop, notebook, tablet, and handheld computers), as well as non-portable computers generally used in one location (such as desktop computers, workstations and/or servers). The computer 30 includes a housing or enclosure 32, the display 12), I/O ports 14, and input structures 16. By way of example only, embodiments of the computer 30 may include a model of a MacBook®, MacBook Pro®, MacBook Air®, iMac®, Mac Mini®, or Mac Pro®, all available from Apple Inc.

The display 12 may be integrated (e.g., the display of a laptop computer) or may be a standalone display that interfaces with the computer 30 through one of the I/O ports 14, such as via a DisplayPort, DVI, High-Definition Multimedia Interface (HDMI), or analog interface. For instance, in certain embodiments, a standalone display 12 may be a model of an Apple Cinema Display®, available from Apple Inc. As will be discussed in further detail below, the display 12 may be an LCD display that includes an LCD panel 34 having an array of metal oxide TFTs, which may be configured to reduce visual artifacts, such as image sticking or green tinting, by providing reduced RC loading and parasitic capacitance, thereby improving overall image quality.

Figure 3:
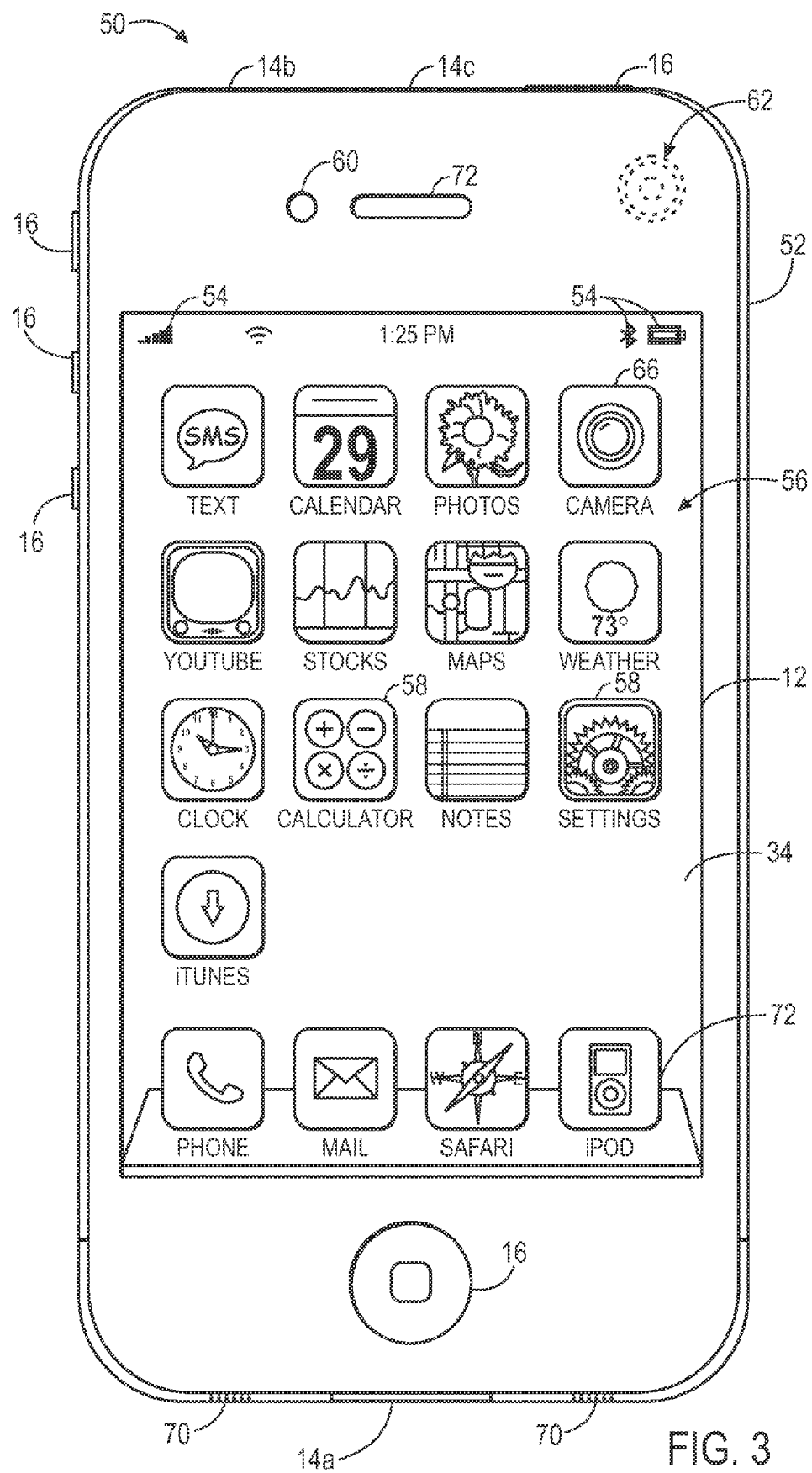
FIG. 3 is a front view of the electronic device of FIG. 1 in the form of a handheld portable electronic device.
Figure 4:
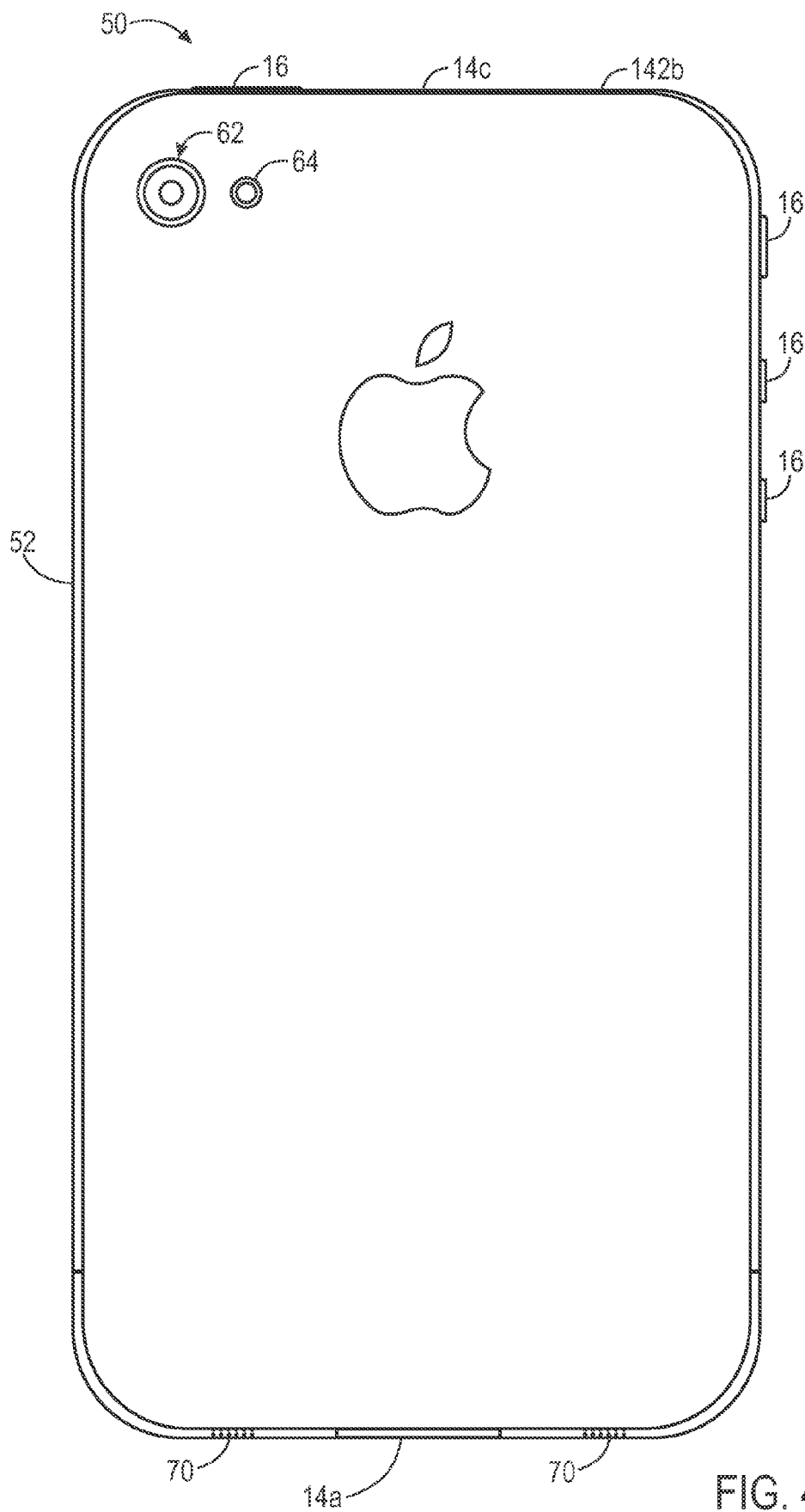
FIG. 4 is a rear view of the handheld electronic device shown in FIG. 3.

FIGS. 3 and 4 depict the electronic device 10 in the form of a portable handheld electronic device 50, which may be a model of an iPod® or iPhone® available from Apple Inc. The handheld device 50 includes an enclosure 52, which may protect the interior components from physical damage and may also allow certain frequencies of electromagnetic radiation, such as wireless networking and/or telecommunication signals, to pass through to wireless communication circuitry (e.g., RF circuitry 26) disposed within the enclosure 52. As shown, the enclosure 52 also includes various user input structures 16 through which a user may interface with the handheld device 50. For instance, each input structure 14 may be configured to control one or more device functions when pressed or actuated.

The device 50 also includes various I/O ports 14, such as connection port 14a (e.g., a 30-pin dock-connector available from Apple Inc.) for transmitting and receiving data and/or for charging a power source 28, which may include one or more removable, rechargeable, and/or replaceable batteries. The I/O ports 14 may also include an audio connection port 14b for connecting the device 50 to an audio output device (e.g., headphones or speakers). In embodiments where the handheld device 50 provides mobile phone functionality, the I/O port 14c may receive a subscriber identity module (SIM) card (e.g., an expansion card 24).

The display 12 of the handheld device 50 may also include the LCD panel 34 and may display various images generated by the device 50. For example, the display 12 may display system indicators 54 providing feedback to a user regarding one or more states of handheld device 50, such as power status, signal strength, and so forth. The display 12 may also display a graphical user interface (GUI) 56 that allows a user to interact with the device 50. In the illustrated embodiment, the displayed image of the GUI 56 may represent a home-screen of an operating system running on the device 50, which may be a version of the Mac OS® or iOS® operating systems, both available from Apple Inc. The GUI 56 may include various graphical elements, such as icons 58, corresponding to applications that may be executed when selected by a user (e.g., receiving a user input corresponding to the selection of a particular icon 58).

The handheld device 50 also includes a front-facing camera 60 on the front side of the device 50 and a rear-facing camera 62 on the rear side of the device (shown in FIG. 4). In certain embodiments, one or more of the cameras 60 or 62 may be used in conjunction with a camera application 66 to acquire images for storage and viewing on the device 50. The rear side of the device 50 may include a flash module (also referred to as a strobe), such as an LED, for illuminating an image scene captured using the camera 62 in low light conditions. The cameras 60 and 62 may also be utilized to provide video-conferencing capabilities, such as via use of Face-Time®, a video conferencing application available from Apple Inc. Additionally, the handheld device 50 may include various audio input and output elements 70 and 72. In embodiments where the device 50 includes mobile phone functionality, the audio input/output elements 70 and 72 may collectively function as the audio receiving and transmitting elements of a telephone.

Figure 5:
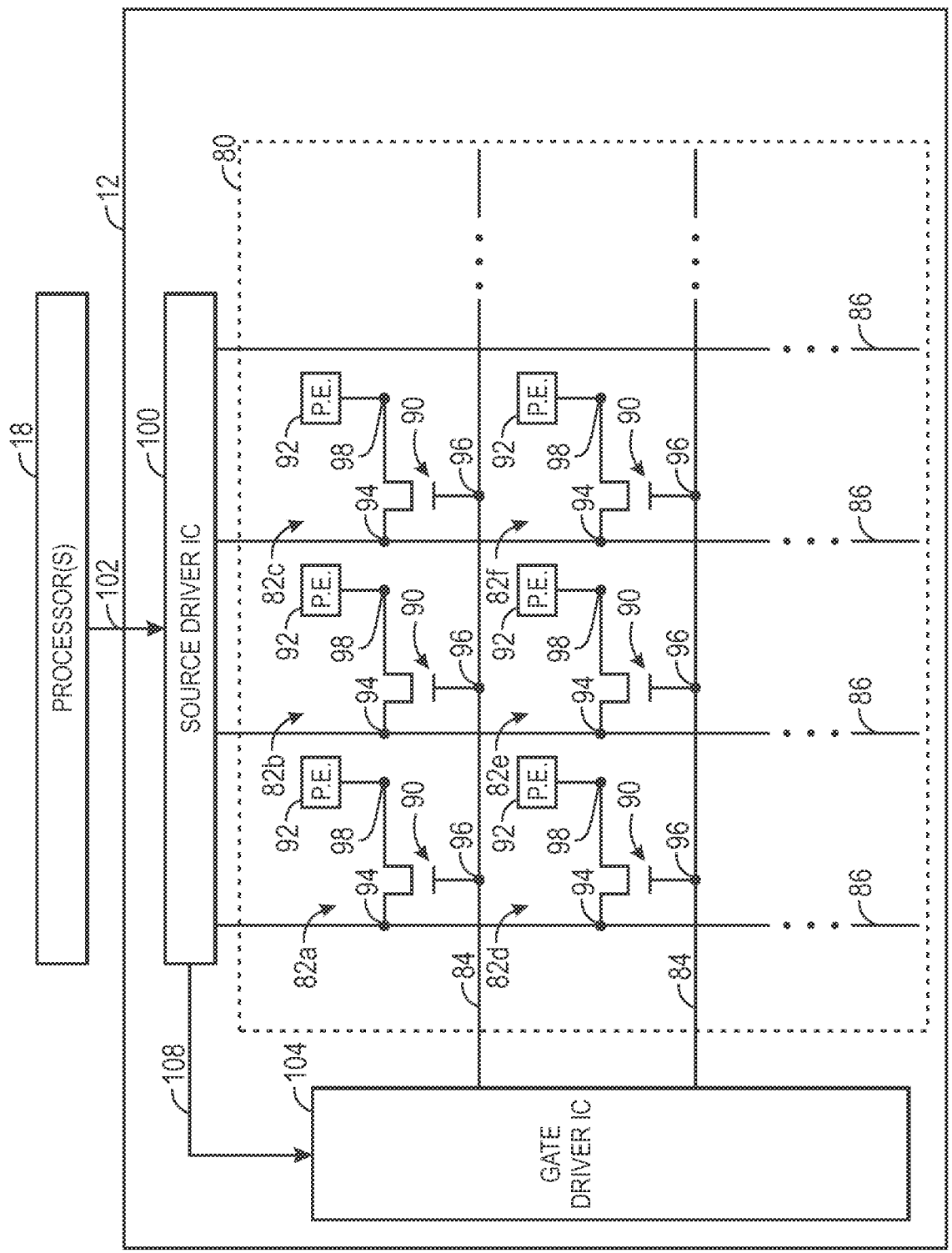
FIG. 5 is a circuit diagram illustrating a portion of an array of unit pixels of the display device of FIG. 1, in accordance with aspects of the present disclosure.

Referring now to FIG. 5 a circuit diagram of the display 12 is illustrated, in accordance with an embodiment. As shown, the display 12 may include a display panel 80, such as a liquid crystal display panel. The display panel 80 may include multiple unit pixels 82 arranged as an array or matrix defining multiple rows and columns of unit pixels 82 that collectively form a viewable region of the display 12 in which an image may be displayed. In such an array, each unit pixel 82 may be defined by the intersection of rows and columns, represented here by the illustrated gate lines 84 (also referred to as "scanning lines") and source lines 86 (also referred to as "data lines"), respectively.

Although only six unit pixels, referred to individually by reference numbers 82a-82f, respectively, are shown, it should be understood that in an actual implementation, each source line 86 and gate line 84 may include hundreds or even thousands of such unit pixels 82. By way of example, in a color display panel 80 having a display resolution of 1024×768, each source line 86, which may define a column of the pixel array, may include 768 unit pixels, while each gate line 84, which may define a row of the pixel array, may include 1024 groups of unit pixels with each group including a red, blue, and green pixel, thus totaling 3072 unit pixels per gate line 84. By way of further example, the panel 80 may have a resolution of 480×320 or, alternatively, 960×640. As will be appreciated, in the context of LCDs, the color of a particular unit pixel generally depends on the color filter that is disposed over a liquid crystal layer of the unit pixel. In the presently illustrated example, the unit pixels 82a-82c may represent a group of pixels having a red pixel (82a), a blue pixel (82b), and a green pixel (82c). The group of unit pixels 82d-82f may be arranged in a similar manner. Additionally, in the industry, it is also common for the term "pixel" may refer to a group of adjacent different-colored pixels (e.g., a red pixel, blue pixel, and green pixel), with each of the individual colored pixels in the group being referred to as a "sub-pixel."

Each unit pixel 82a-82f shown in FIG. 5 includes a thin-film transistor (TFT) 90 for switching a respective pixel electrode 92. As discussed above, the TFT 90 may be a metal oxide TFT, with its active layer being formed from a metal oxide material. By way of example only, such metal oxides may include an indium-based ternary material (In—X—O), such as indium gallium zinc oxide (InGaZnO), or may include zirconium indium zinc oxide (ZrInZnO), hafnium indium zinc oxide (HfInZnO), zinc tin oxide (ZnSnO), or gallium tin zinc oxide (GaSnZnO). The pixel electrode 92 may be formed from indium tin oxide (ITO), or any suitable electrically conductive material that provides optical transparency.

In the illustrated embodiment, the source 94 of each TFT 90 may be electrically connected to a source line 86. Similarly, the gate 96 of each TFT 90 may be electrically connected to a gate line 84. Furthermore, the drain 98 of each TFT 90 may be electrically connected to a respective pixel electrode 92. Each TFT 90 serves as a switching element and may be activated and deactivated (e.g., switched on and off) for a predetermined period based upon the respective presence or absence of a gate activation signal (also referred to as a scanning signal) at the gate 96 of the TFT 90. For instance, when activated, the TFT 90 may store the image signals received via a respective source line 86 as a charge in its corresponding pixel electrode 92. The image signals stored by pixel electrode 92 may be used to generate an electrical field between the respective pixel electrode 92 and a common electrode (not shown in FIG. 5), which may collectively form a capacitor for a given unit pixel 82. The electrical field may align liquid crystals molecules within a liquid crystal layer to modulate light transmission through a region of the liquid crystal layer corresponding to the unit pixel 82. For instance, light is typically transmitted through the unit pixel 82 at an intensity corresponding to the applied voltage (e.g., from a corresponding source line 86).

The display 12 also includes a source driver integrated circuit (IC) 100, which may include a chip, such as a processor or ASIC, configured to control various aspects of display 12 and panel 80. For example, the source driver IC 100 may receive image data 102 from the processor(s) 18 and send corresponding image signals to the unit pixels 82 of the panel 80. The source driver IC 100 may also be coupled to a gate driver IC 104, which may be configured to provide/remove gate activation signals to activate/deactivate rows of unit pixels 82 via the gate lines 84. The source driver IC 100 may include a timing controller that determines and sends timing information 108 to the gate driver IC 104 to facilitate activation and deactivation of individual rows of pixels 82. In other embodiments, timing information may be provided to the gate driver IC 104 in some other manner (e.g., using a timing controller that is separate from the source driver IC 100). Further, while FIG. 5 depicts only a single source driver IC 100, it should be appreciated that other embodiments may utilize multiple source driver ICs 100 to provide image signals 102 to the pixels 82. For example, additional embodiments may include multiple source driver ICs 100 disposed along one or more edges of the panel 80, with each source driver IC 100 being configured to control a subset of the source lines 86 and/or gate lines 84.

In operation, the source driver IC 100 receives image data 102 from the processor 18 or a discrete display controller and, based on the received data, outputs signals to control the pixels 82. For instance, to display image data 102, the source driver IC 100 may adjust the voltage of the pixel electrodes 92 (abbreviated in FIG. 5 as P.E.) one row at a time. To access an individual row of pixels 82, the gate driver IC 104 may assert a gate activation signal to the TFTs 90 associated with the particular row of pixels 82 being addressed, which causes those TFTs 90 to switch on. This activation signal may render the TFTs 90 on the addressed row conductive, and image data 102 corresponding to the addressed row may be transmitted from source driver IC 100 to each of the unit pixels 82 within the addressed row via respective data lines 86. Thereafter, the gate driver IC 104 may deactivate the TFTs 90 in the addressed row by de-asserting the gate activation signal, thus switching the TFTs 90 of the row off and impeding the pixels 82 within that row from changing state until the next time they are addressed. The above-described process may be repeated for each row of pixels 82 in the panel 80 to reproduce image data 102 as a viewable image on the display 12.

Figure 6:
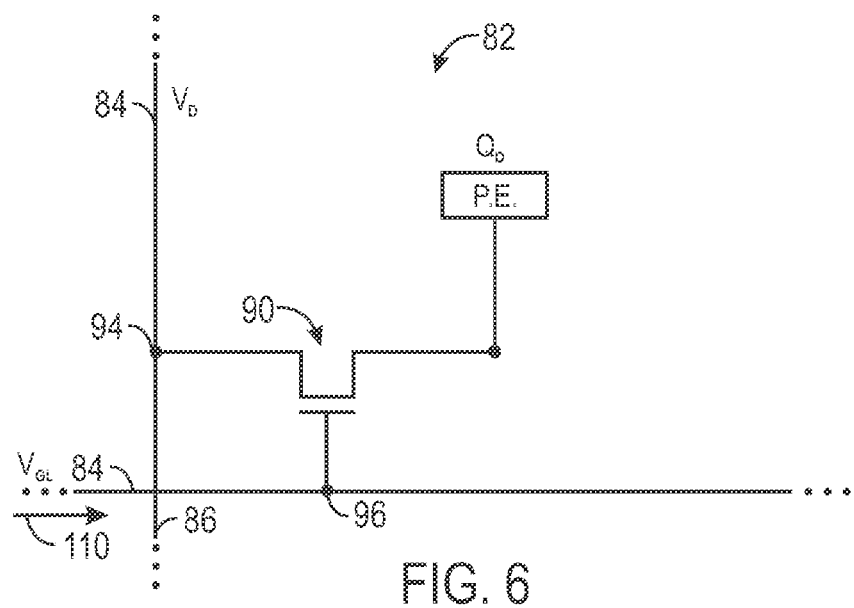
FIG. 6 shows one of the unit pixels from FIG. 5 that includes a metal oxide TFT, in accordance with aspects of the present disclosure.

Referring to FIG. 6, a single unit pixel 82 that may be one of the unit pixels 82 shown in the panel 80 of FIG. 5 is illustrated in further detail. The gate line 84 may provide a gate activation signal 110 corresponding to a voltage, referred to as $V_{GL}$. When the voltage $V_{GL}$ is equal to or greater than the threshold voltage of the TFT 90, the TFT 90 switches on, and a conductive path is formed between the source line 86 and the pixel electrode 92. Accordingly, a data voltage $V_D$ provided to the source line 86 and corresponding to image data may be stored in the pixel electrode 92 as a charge $Q_D$ representative of the data voltage $V_D$. When the gate activation signal 110 is de-asserted, such that the $V_{GL}$ drops below the threshold voltage of the TFT 90, the TFT switches to an off state. The charge $Q_D$ generally remains stored in the pixel electrode 92 until the next time the gate line 84 is addressed (e.g., for the next frame of image data).

Figure 7:
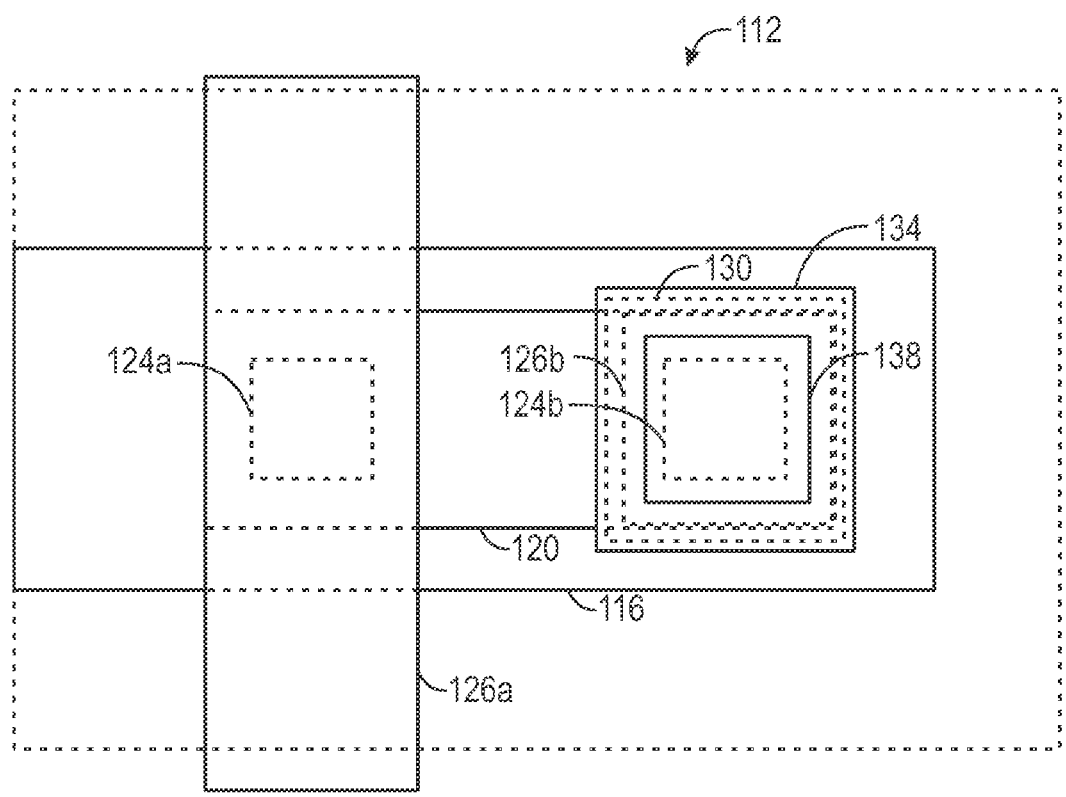
FIG. 7 shows a partial top view of a conventional TFT that may be used to implement a unit pixel for a conventional display.
Figure 8:
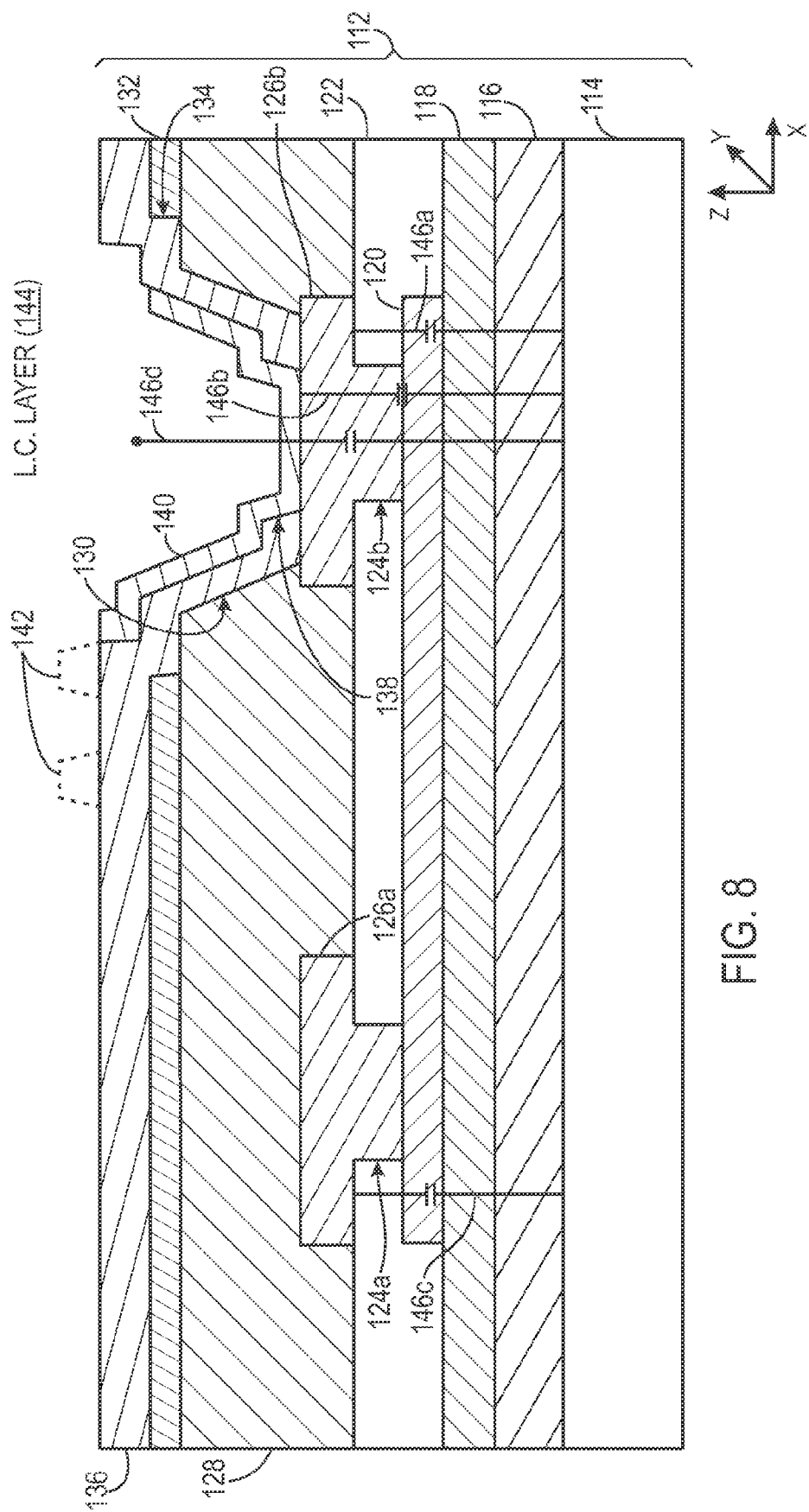
FIG. 8 shows a cross sectional view of the conventional TFT of FIG. 7, and also illustrates parasitic capacitances between a gate line and other components of the unit pixel.

Before continuing, it may be beneficial to describe some of the drawbacks faced by display devices with conventional TFT designs. FIGS. 7 and 8, which are described together below, illustrate a partial top view and cross-sectional view, respectively, of a conventional TFT 112. As shown, the TFT 112 includes a glass substrate 114 on which a gate 116 is formed. For instance, the gate 116 may be part of a gate line connecting the gates of multiple TFTs 112. A gate insulation layer 118 may be formed over (e.g., above in the z-direction) the gate line 116. Next a semiconductor layer 120, which may serve as the active layer/channel for the TFT 112, is formed over the gate insulation layer 118. By way of example, the active layer 120 may be formed from a silicon-based material, such as a-Si, poly-Si, and so forth. An etch stopper layer 122 may then be formed over the active layer 120, as shown in FIG. 8. Next, contact holes 124a and 124b may be formed in the etch stopper layer 122, such as via patterning and etching, and a metal may be deposited within the holes 124a and 124b to form the source 126a and drain 126b terminals of the TFT 112. For instance, the source 126a may be part of a source line that connects to multiple TFTs 112 within a column of pixels in an LCD panel.

An organic layer 128, which may function as a passivation layer, is then deposited over the source 126a, drain 126b, and etch stopper layer 122. A hole 130 is then formed (e.g., via an etching process) in the organic layer 128, as shown in FIGS. 7 and 8. Next, an electrode layer 132, which provides the common voltage electrode (Vcom), is formed over the organic layer 128, following by the formation of a Vcom hole 134. Next, a passivation layer 136 (e.g., SiN$_x$) is formed over the Vcom electrode 132. A pixel contact hole 138 may be formed through the passivation layer 136, and a pixel electrode 140 may be formed with a portion that contacts the drain 126b through the pixel contact hole 138. As shown in FIG. 8, the pixel electrode 140 may have finger-like structures 142 (sometimes called "finger electrodes") that are shown in phantom in FIG. 8, as they are not necessarily in the same plane through which the cross sectional view of the TFT 112 is taken. As can be appreciated, multiple TFTs 112 may be formed along the gate line 116 and along the source line 126a.

As discussed above, conventional TFTs, such as the TFT 112, used in display devices may not be designed to provide reduced RC loading and parasitic capacitance. Referring still to FIG. 8, when a gate activation signal is sent along the gate line 116, parasitic capacitance may affect the operation of the pixel. For instance, as illustrated in FIG. 8, parasitic capacitances 146a, 146b, and 146c may be present between the gate line 116 and the drain 126b, between the gate line 116 and the pixel electrode 140, and between the gate line 116 and the source line 126a, respectively. These parasitic capacitances may interfere with operation of the pixel (e.g., affecting the charge stored by the pixel electrode 140 and/or the data being transmitted via the source line 126a), which may result in the appearance of certain visual artifacts, such as image sticking, color shift, and other color inaccuracies. Further, in the conventional TFT 112 shown in FIGS. 7-8, coupling (shown by reference number 146d), between the gate activation signal (V$_{GL}$) being sent via the gate line 116 and liquid crystal materials and/or polyimide materials in the liquid crystal layer 144 disposed over the pixel may cause light leakage and/or green tinting artifacts to appear.

The parasitic capacitances 146a-146d discussed above may also contribute to increased RC loading in the gate line, which may potentially cause visual artifacts by affecting (e.g., degrading) a gate activation signal. As can be appreciated, loading may be dependent on the time constant τ of the gate line 116, where τ=RC. As TFTs 112 in an addressed row are activated, a voltage is written to each TFT, which causes a charge to be stored in the pixel electrode 140. Thus, as the gate activation signal propagates down the length of the gate line 116, the overall cumulative capacitance increases as each TFT 112 within the addressed row switches on. This is due at least in part to the parasitic capacitances that exist between the gate line 116 and each TFT 112 that is switched on. In other words, the time constant τ may increase as the gate activation signal propagates further down the gate line 116, which may cause the gate activation signal to degrade as it propagates along the gate line 116. In this case, the time constant τ may be expressed as τ=RΔC, where ΔC represents the changing capacitance along the gate line 116.

Figure 9:
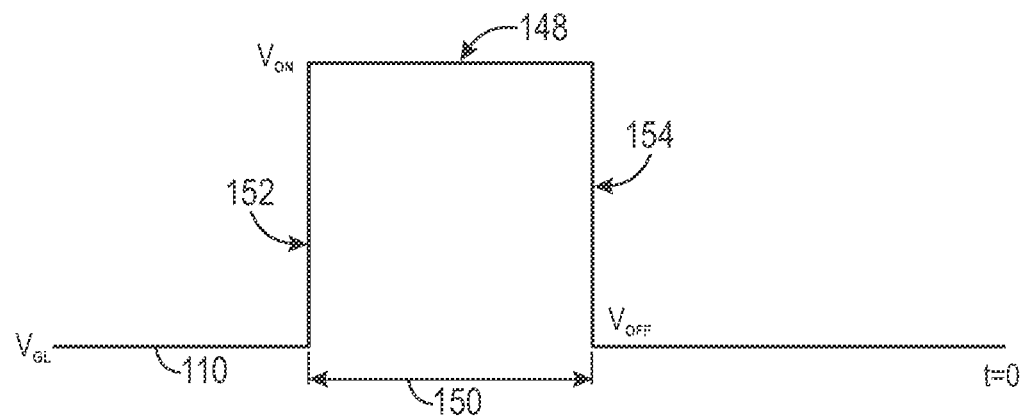
FIGS. 9-10 show how a gate activation signal may degrade as the signal propagates along a gate line due to loading.

By way of illustration, FIG. 9 shows a gate activation signal 110 provided from a gate driver circuit for activating an addressed row just after it is received by the gate line 116 (e.g., time t=0), wherein the pulse 148 represents an activation voltage sufficient to switch on the TFTs 112. As shown in FIG. 9, the pulse 148 has a rising edge 152 that rises almost immediately to V$_{ON}$, which represents a voltage sufficient for switching on the TFT 112, and a falling edge 154 that falls almost immediately to V$_{OFF}$ at the end of the pulse 148, which represents the value of the signal 110 when the TFT 112 is switch off again. Because the rising edge 152 and falling edge 154 shown in FIG. 9 are very brief (e.g., substantially instantaneous), the pulse 148 remains at V$_{ON}$ for substantially the entire duration 150 of the pulse 148.

Figure 10:
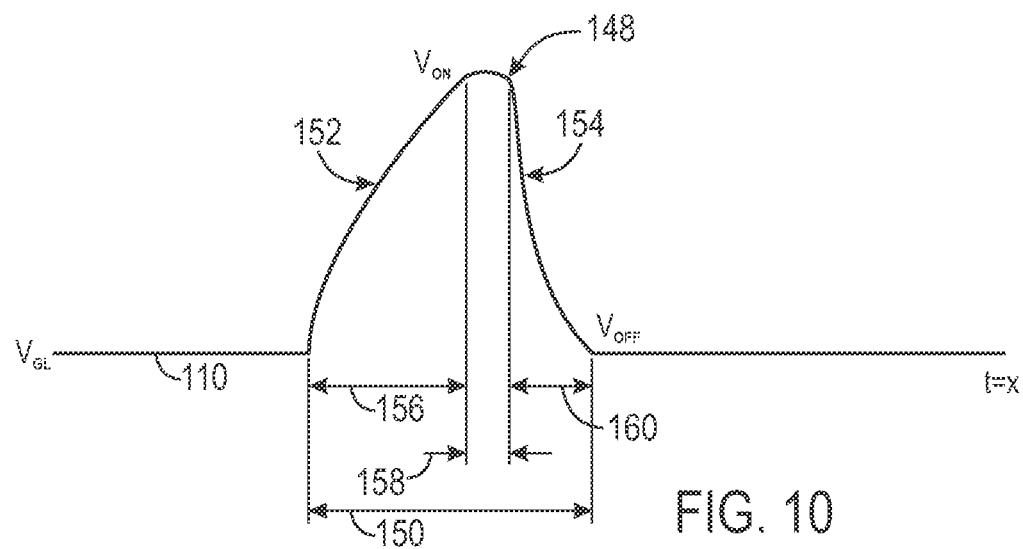

Contrast this with the same gate activation signal 110 after it has propagated along the gate line 116 for some time t=x (e.g., assume the signal is near the end of the gate line 116). As shown in FIG. 10, the pulse 148 is noticeably degraded compared to the pulse 148 shown in FIG. 9. For instance, within the duration 150 of the pulse 148 in FIG. 10, it takes the rising edge 152 the interval 156 to reach V$_{ON}$. Further, the falling edge 154 takes the interval 160 to transition from V$_{ON}$ to V$_{OFF}$. Therefore, the pulse 148 is only sustained at V$_{ON}$ for the interval 158, which is a fraction of the duration 150 of the pulse. As will be appreciated, this may result in a TFT 112 switching on for only a fraction of the intended time (e.g., duration 150). As a result, the charge stored in the pixel electrode 140 may not reach its intended value, which may result in color inaccuracies. When viewing a display device that exhibits large RC loading, a color shift across the display may be present even when an image is suppose to be a uniform color. For instance, an image that is supposed to be displayed as an all white or all black image may exhibit some gray coloring at one edge of the display opposite from the gate driver circuitry (e.g., from which the gate activation signals originate).

Accordingly, referring again to the display 12 shown in FIGS. 5 and 6, the display pixels 82 include TFTs 90 that are configured, in accordance with aspects of the present disclosure, to provide reduced parasitic capacitance between the gate line 84 and various components of the pixel 82. As discussed below, when compared to the conventional TFT 112 of FIGS. 7 and 8, the TFTs 90 of the pixels 82 may exhibit reduced parasitic capacitance between the gate lines 84 and other components of the pixel 82, and the display panel 80 may exhibit reduced RC loading in the gate lines 84, which may thus help to reduce the appearance of certain visual artifacts, such as image sticking and green tinting, while also improving color accuracy of the display 12.

Figure 11:
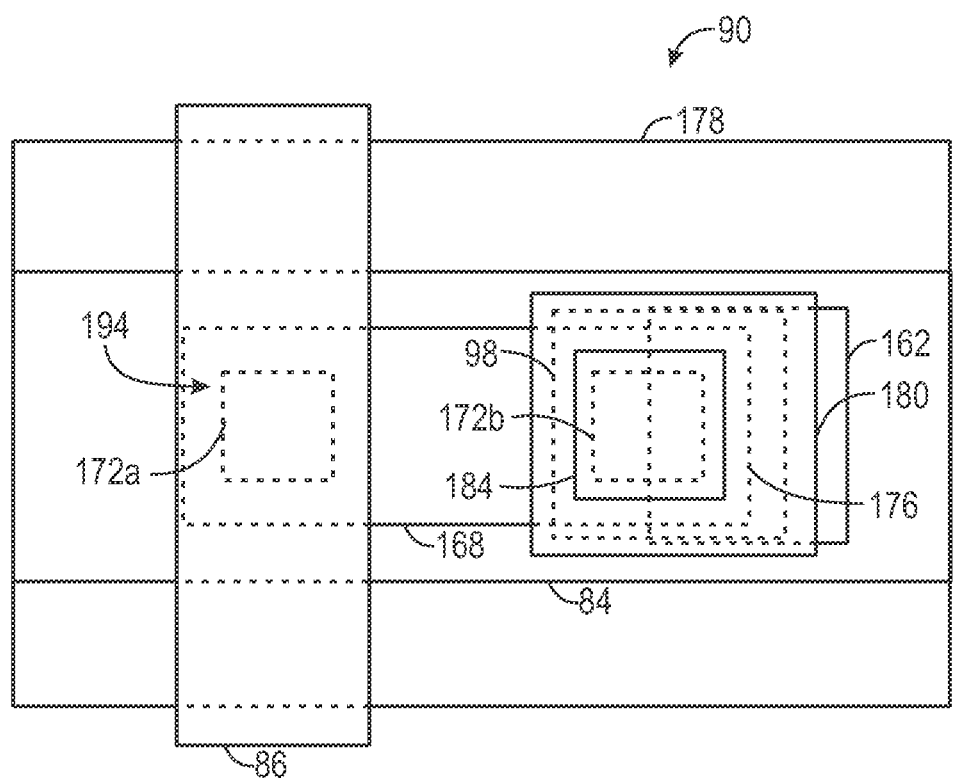
FIG. 11 shows a partial top view of a metal oxide TFT, in accordance one embodiment of the present disclosure.
Figure 12:
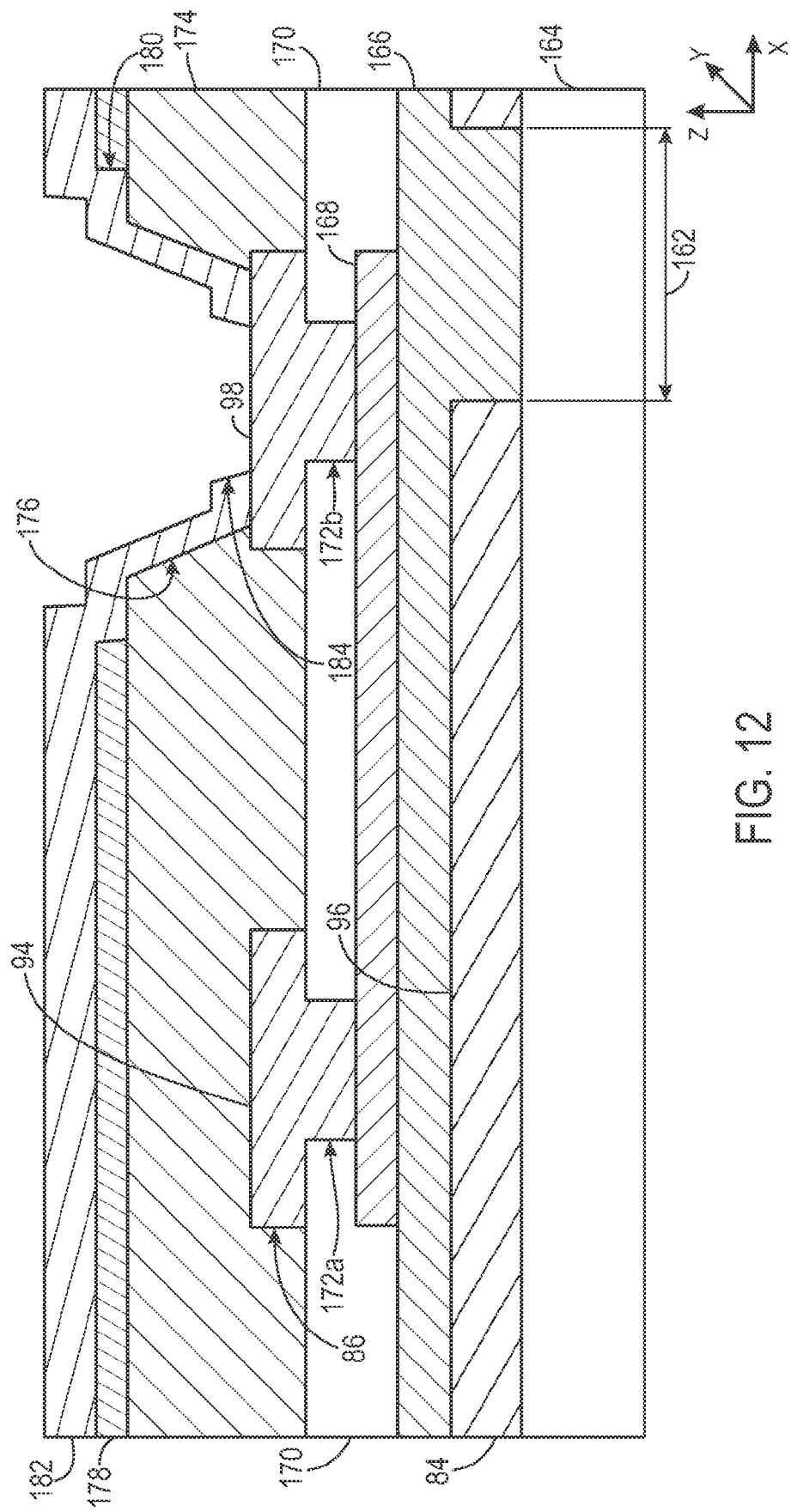
FIG. 12 shows a cross sectional view of the metal oxide TFT of FIG. 11.
Figure 13:
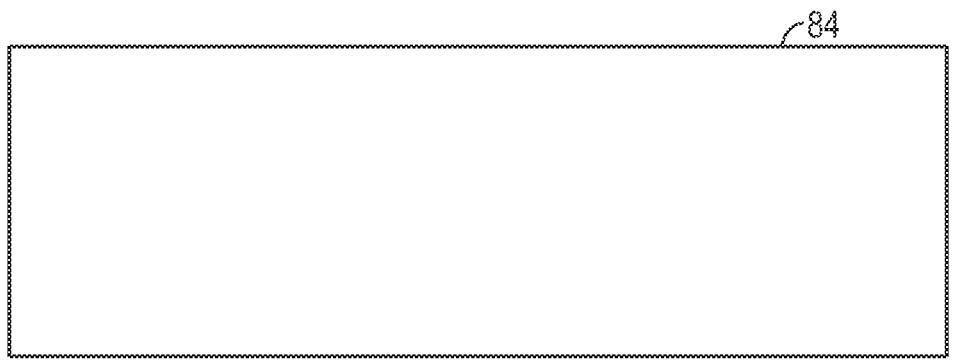
FIGS. 13-19 depict steps for fabricating the metal oxide TFT of FIG. 11.

An embodiment of the TFT 90 is shown in FIGS. 11 and 12, which provide a partial top view and a cross-sectional view of the TFT 90, respectively. Further, FIGS. 13-19 depict certain fabrication process steps for manufacturing the TFT 90 shown in FIGS. 11 and 12, and will be referenced below in the description of FIGS. 11 and 12. Referring concurrently to FIGS. 11 and 12, the TFT 90 includes a glass substrate 164 on which a conductive material 84 is deposited to form the gate line. Thus, a portion of the gate line 84 effectively functions as the gate 96 for the TFT 90. The formation of the gate line 84 is depicted in FIG. 13. As can be appreciated, the gate line 84 may be formed using any suitable semiconductor process, such as physical vapor deposition (PVD) or chemical vapor deposition (CVD).

Figure 14:
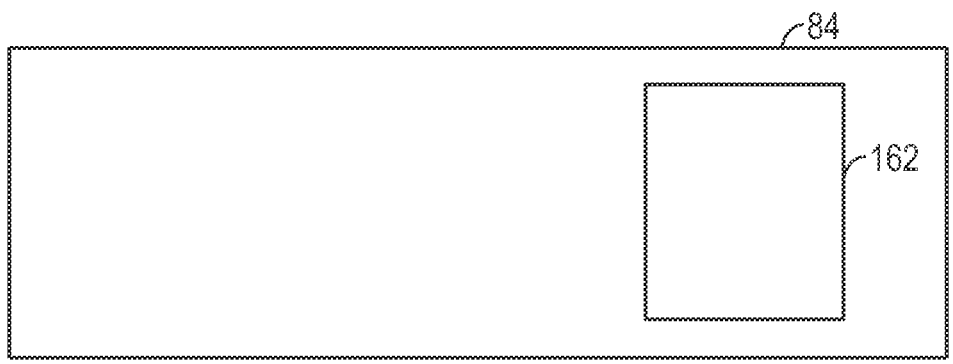

Next, a hole 162, referred to herein as a "gate hole" is formed within the gate line 84. For instance, the gate hole 162, which may expose the substrate 164, may be formed by patterning the gate line 84 and using an etch process. As shown in FIGS. 11 and 12, the position of the gate hole 162 is such that the hole 162 is at least partially overlapped by the drain 98 of the TFT 90. The formation of the gate hole 162 is shown in FIG. 14. As can be appreciated, while only one gate hole 162 is shown in FIGS. 11 and 12, multiple gate holes 162 may be formed along the gate line 84, with one gate hole 162 corresponding to each TFT 90 in the row corresponding to the gate line 84. As will be discussed in further detail below, the formation of the gate hole 162 decreases the area of the region of the gate line 84 below (e.g., in the z-direction) the drain 98 of the TFT 90. This may reduce parasitic capacitance between the gate line 84 and drain 98, pixel electrode 92, and even the liquid crystal material (not shown in FIG. 12), and may also contribute to reduced RC loading.

Figure 15:
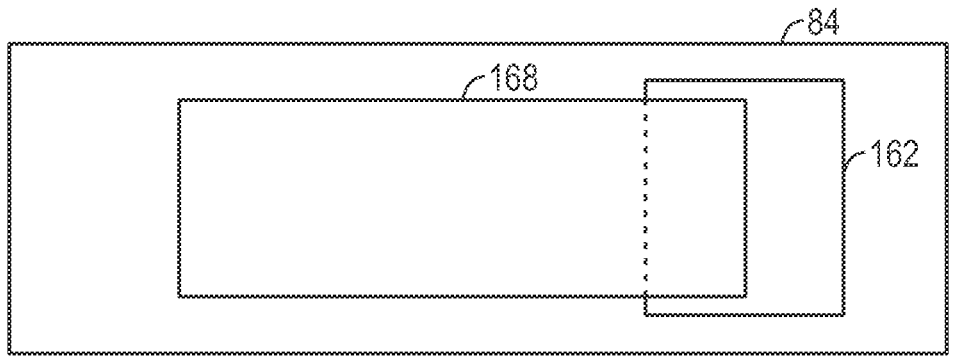

Following the formation of the gate hole 162, a gate insulation layer 166 may be formed over the gate line 84. For instance, the formation of the gate insulation layer 166 may fill the gate hole 162, as shown in FIG. 12. Thereafter, a metal oxide semiconductor material may be formed over the gate insulation layer 166 and may be patterned and etched to form an active layer or channel 168 for the TFT 90. By way of example only, the metal oxide semiconductor material may be indium gallium zinc oxide (InGaZnO) in one embodiment. In other embodiments, the active layer 168 may include zirconium indium zinc oxide (ZrInZnO), hafnium indium zinc oxide (HfInZnO), zinc tin oxide (ZnSnO), or gallium tin zinc oxide (GaSnZnO). The step of forming the active layer 168 is shown in FIG. 15. As shown, one end of the active layer 168, which will eventually form the drain 98 of the TFT 90, at least partially overlaps the gate hole 162 in the x-direction (FIG. 12). The use of metal oxide semiconductor materials in the TFT 90 offers several advantages over TFTs with active layers formed from other types of materials, such as silicon-based materials (e.g., poly-Si, a-Si). For instance, metal oxide semiconductors generally exhibit improved semiconductor mobility compared to silicon-based materials. Additionally, the use of metal oxide semiconductors for the active layer 168 may allow for a reduction in the size of the TFT 90 when compared to conventional TFTs having active layers formed from silicon-based materials. As discussed in more detail below, this may allow for a reduction in the black mask area, which may translate into an increase in the aperture size for each pixel, thereby improving the overall transmittance of the display 12.

Figure 16:
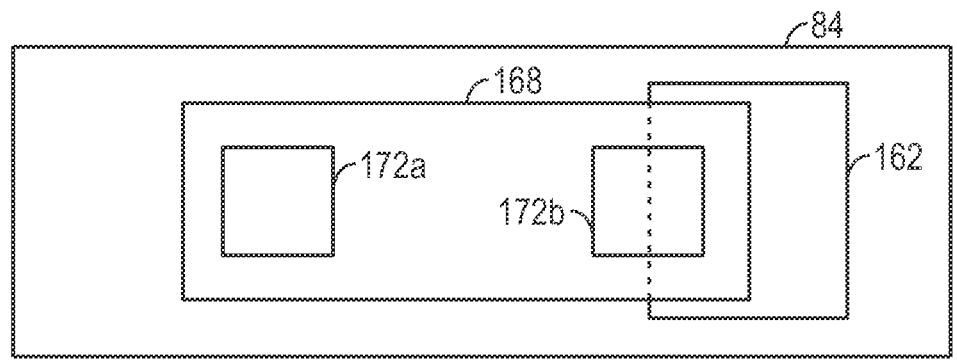
Figure 17:
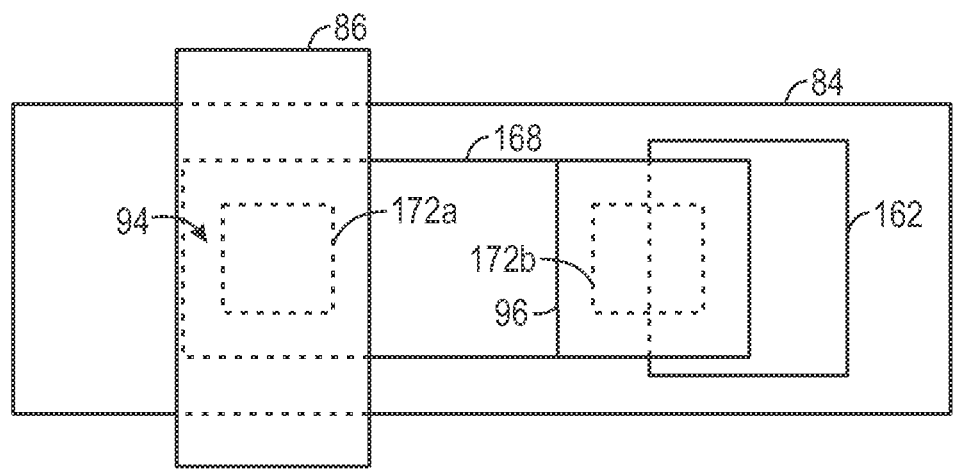

Next, an etch stopper layer 170 is formed over the active layer 168. The etch stopper layer 170 is typically provided when the TFT 90 is produced using an etch stopper process, wherein the etch stopper layer 170 acts as an insulating layer. For instance, the etch stopper layer 170 may be formed from silicon nitride or silicon nitroxide in some embodiments. Further, while the presently illustrated embodiments show an etch stopper process, other embodiments of the TFT 90 may also be fabricated using an etch back process. Following the formation of the etch stopper layer 170, two contact holes 172a and 172b (etch stopper (ES) contact holes) are formed to expose the active layer 168. The contact holes 172a and 172b may be formed via a patterning and etch process. This step is shown in FIG. 16.

Figure 18:
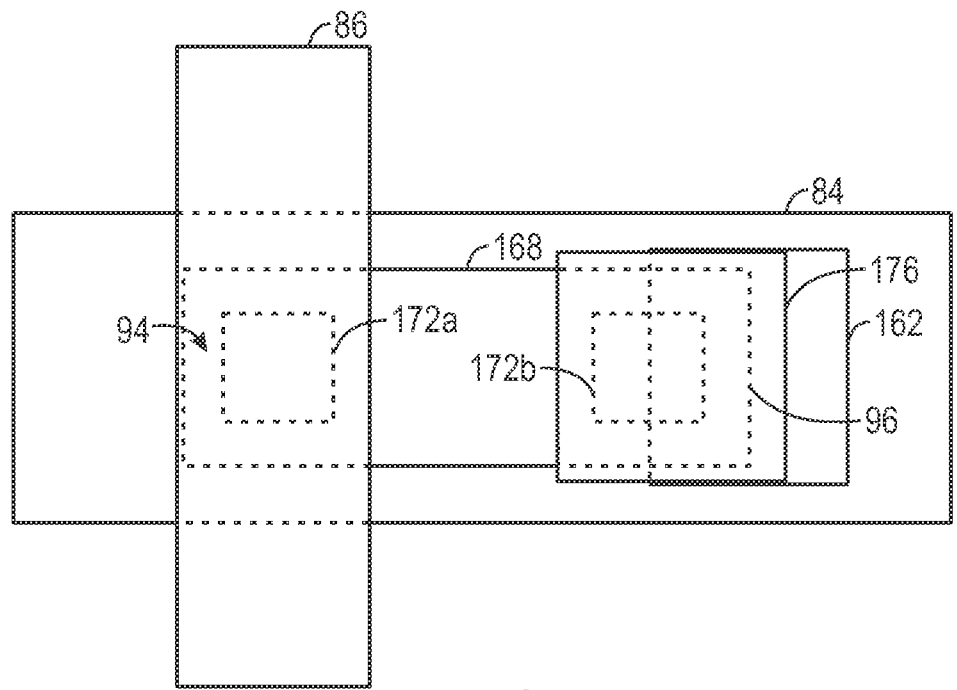

Conductive material is then deposited over the ES contact holes 172a and 172b to form the source 94 and the drain 98, respectively, of the TFT 90. As shown in more detail in FIG. 17, the formation of the source 94 may include forming a source line 86, to which other TFTs 90 in the same column within the LCD panel 80 are connected. Further, it should be noted that the drain 98 also at least partially overlaps the gate hole 162 (e.g., in the x-direction). Following the formation of the source 94 and drain 98, an organic insulating layer 174 is formed, as shown in FIG. 12. The organic layer 174 may function as a passivation layer. Subsequently, a hole 176 (organic hole) is formed in the organic layer 174 using any suitable semiconductor process (e.g., pattern and etch), and exposes a portion of the drain 98. This step is shown in FIG. 18, which depicts the hole 176 of the present embodiment as having dimensions that are greater than those of the ES contact hole 172b and being generally centered over the ES contact hole 172b. Though the organic layer 174 itself is not shown in FIG. 16, it should be understood that the organic layer 174 would be located over the elements that are shown in FIG. 16.

Figure 19:
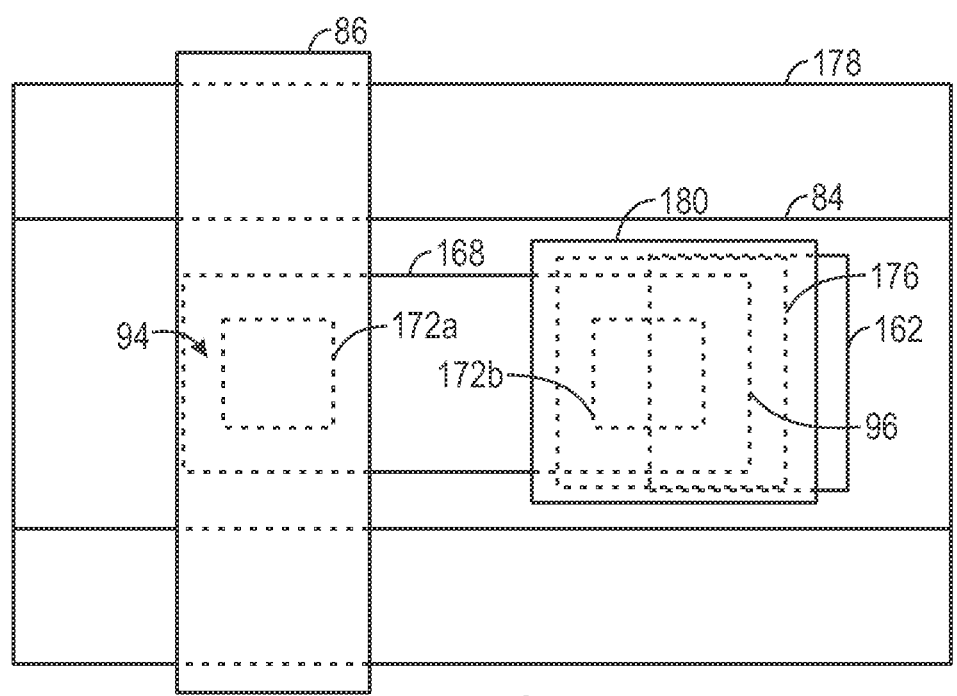

Thereafter, a common voltage (Vcom) electrode 178 is formed over the organic layer 174. The Vcom electrode 178 may be formed from a conductive material with optically transparent properties, such as indium tin oxide (ITO). A hole 180 ("Vcom hole") is then formed in the Vcom electrode 178 using any suitable semiconductor process. As part of this step, the electrode material may initially be deposited such that the organic hole 176 is filled, thus covering the previously exposed drain 98. The process of forming the Vcom hole 180 would then involve removing (e.g., via etching) a portion of the layer 178, which may expose the drain 98 again as well as a portion of the organic layer. These steps are further illustrated in FIG. 19. As shown, the Vcom hole 180 has dimensions that are greater than those of the organic hole 176 and is generally centered over the organic hole 176. Thus, in the present embodiment, the ES contact hole 172b, the organic hole 176, and the Vcom hole 180 may be arranged in a generally concentric manner, as shown in FIG. 19, which each successive hole structure having greater dimensions. Further, the Vcom electrode 178 may at least partially shield the pixel electrode 92 from gate line 84, thus reducing crosstalk.

Figure 20:
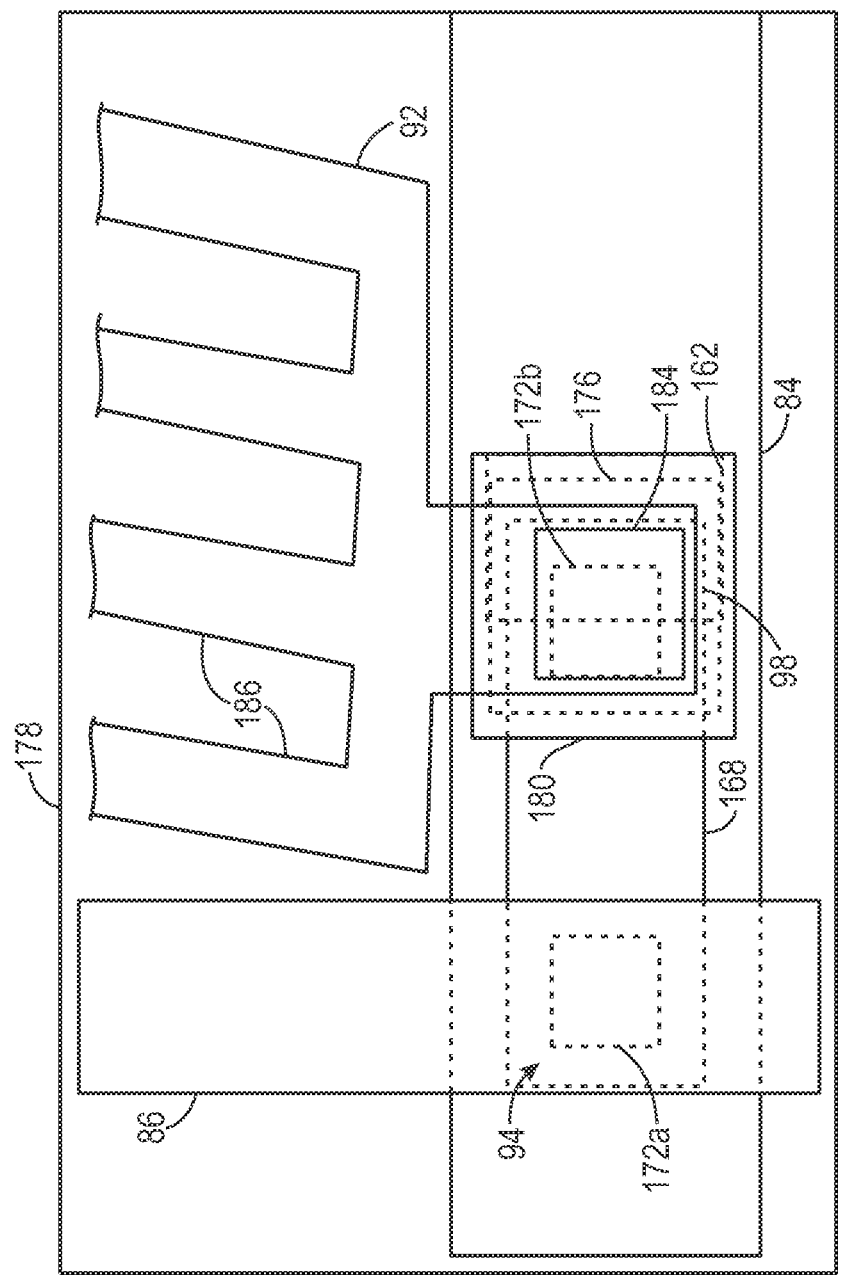
FIG. 20 shows the metal oxide TFT of FIG. 11 with a pixel electrode coupled to the metal oxide TFT through a pixel contact hole, in accordance with aspects of the present disclosure.
Figure 21:
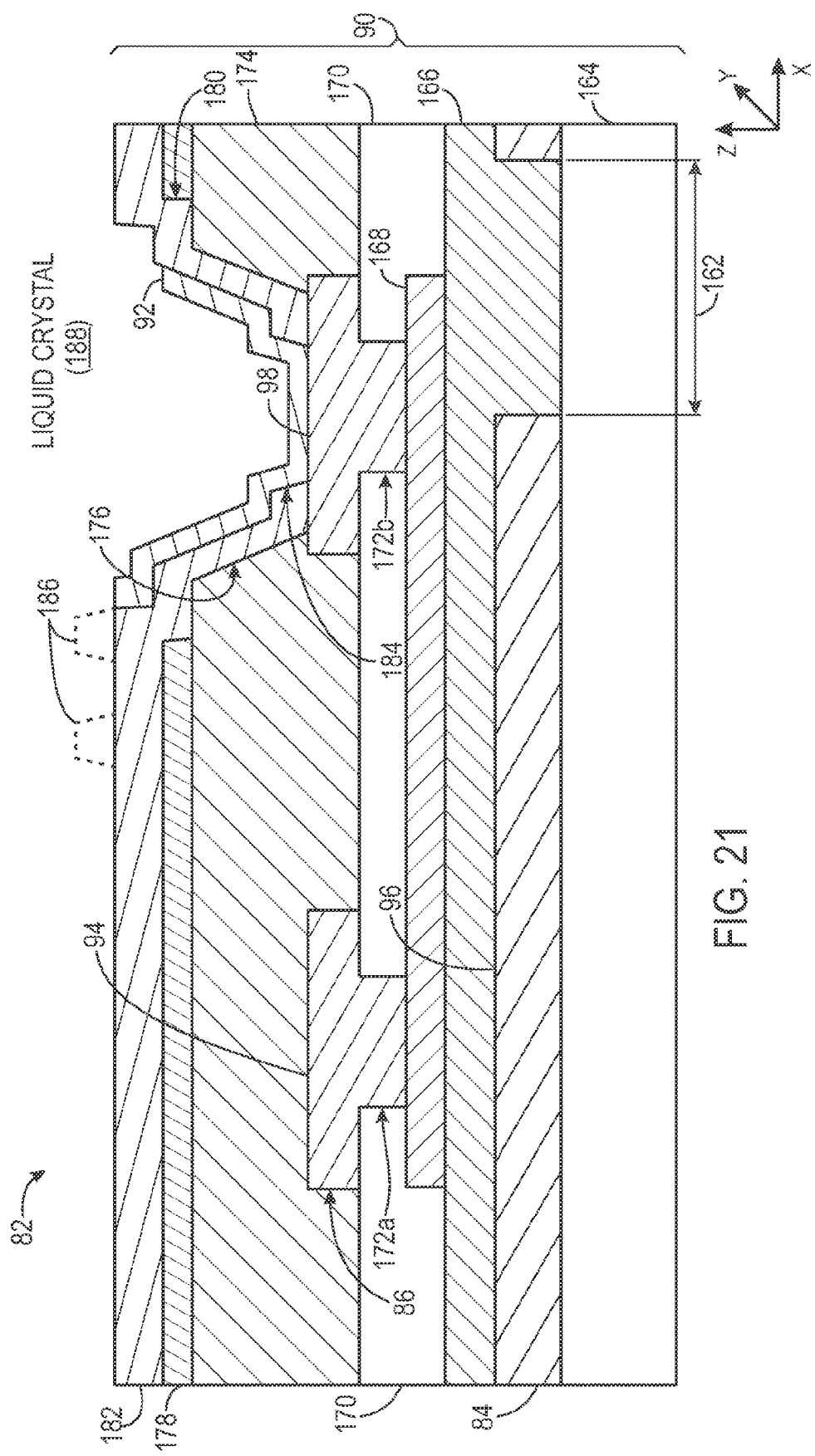
FIG. 21 shows a cross sectional view of the metal oxide TFT with the pixel electrode, as shown in FIG. 20.

Next, a passivation layer 182 is formed over the Vcom electrode 178. As shown in FIG. 12, the passivation layer 182 may at least partially fill the Vcom hole 180 and the organic hole 176. The passivation layer may then be etched to form a pixel contact hole 184, which may expose a portion of the drain 98 once again. Thus, from the step shown in FIG. 19, the formation of the pixel contact hole 184 results in the completed structure of the TFT 90 shown in FIG. 11. In the present embodiment, the pixel contact hole 184 is also generally concentric with the ES contact hole 172b, the organic hole 176, and the Vcom hole 180, but has smaller dimensions relative to the organic hole 176 and Vcom hole 180. As discussed in further detail below, a portion of the pixel electrode 92 is formed within the contact hole 184, thus connecting the pixel electrode 92 to the drain 98 of the TFT 90. For example, referring to FIGS. 20 and 21, a partial top view and a cross-sectional view, respectively, of a unit pixel 82 illustrating the TFT 90 with the pixel electrode 92. The pixel electrode 92 may include one or more finger-like structures 186 (e.g., "finger electrode").

It should be understood that the formation of all the layers in the TFT 90, as described above, may be accomplished using any suitable process, such as physical vapor deposition (PVD) or chemical vapor deposition (CVD), and that the formation of the holes (e.g., 172a, 172b, 176, 180, 184) may also be formed using any suitable process, such as a patterning and etching process. Moreover, while FIGS. 11-19 show the formation of a single TFT, it should be understood that the described process may be carried out to fabricate an entire panel of TFTs simultaneously.

As discussed above, the TFT 90 provides reduced parasitic capacitance and RC loading and may reduce the appearance of certain visual artifacts on the display 12, such as image sticking and green tinting, while also improving color accuracy. These improvements are provided at least in part by the formation of the gate hole 162 in the gate line 84, wherein each TFT 90 in the row corresponding to the gate line 84 may include a gate hole 162. As can be appreciated, by removing portions of the gate line 84 to form the hole 162, the area of the region of the gate line 84 disposed below the drain 98 of the TFT 90 is reduced. With this in mind, capacitance may be expressed as:

$$C = \frac{\varepsilon_r \varepsilon_0 A}{d} \quad \text{(Eq. 1)}$$

wherein $\varepsilon_r$ and $\varepsilon_0$ represent a dielectric constant and an electric constant, respectively, A represents the area of overlap between two elements (e.g., plates) forming a capacitive element, and d represents the distance between the two elements. As can be appreciated, the variables $\varepsilon_r$ and $\varepsilon_0$ are generally constant depending on the selected materials, and it may generally be undesirable to increase d, as this may increase the thickness of the LCD panel. Accordingly, by reducing the area of the gate line 84 that is disposed beneath the drain 98, parasitic capacitances that may exist between the gate line 84 and the drain 98 and/or between the gate line 84 and the pixel electrode 92 may be reduced. Further, parasitic capacitance may also be reduced between the gate line 84 and the materials in the liquid crystal layer 188 disposed over the pixel 82. For instance, as discussed above, coupling between the gate activation voltage and liquid crystal and/or polyimide material in the liquid crystal layer 188 may cause certain artifacts, such as green tinting to occur.

Further, since parasitic capacitance is reduced for each TFT 90 in the gate line, RC loading also decreases, which reduces the amount of signal degradation of the gate activation signal 110, as discussed above with reference to FIGS. 9-10. For instance, since RC loading behavior is dependent upon a time constant that may increase as the gate activation signal propagates along the gate line due at least in part to cumulative parasitic capacitance ($\tau=R\Delta C$) effects along the gate line as each TFT 90 is switched on, the reduction in parasitic capacitance due to the presence of the gate hole 162 at each TFT 90 reduces $\Delta C$, thereby decreasing RC loading and improving the signal quality of the gate activation signal 110, thus enhancing the switching performance of the TFTs 90. By way of example, the use of the gate holes described in the present disclosure may reduce RC loading by between approximately 20 to 60 percent in some embodiments when compared to the conventional TFT 112 described with reference to FIGS. 7-8.

In certain embodiments the formation of the gate holes 162 may reduce the overall area of the gate line 84 may between approximately 5 to 30 percent. Further, while the gate holes 162 have been illustrated as being generally square or rectangular in shape, it should be understood that gate hole 162 may be formed in any suitable shape, including circular, oval, diamond, and so forth. Further, in some embodiments utilizing square or rectangular shaped gate holes 162, such gate holes may have a width that is between approximately 50 to 95 percentage of the width of the gate line and a length that is equal to the width or a percentage thereof (e.g., 50 to 99 percent). As will be appreciated, the dimensions of the gate hole 162 may be selected such that the decrease in $\Delta C$ is not outweighed by an increase in resistance of the gate line 84 due to the decrease in the area. For instance, if the gate holes 162 are too large, the resistance of the gate line 84 may increase, which may negate or nullify the benefits of reduced parasitic capacitance by increasing $\tau$.

A further benefit provided by the TFT 90 relates to reduction of power consumption. For instance, power may be expressed using the following equation:

$$P = f \times C \times V^2 \quad \text{(Eq. 2)}$$

Wherein P represents power (in watts), V represents a voltage (e.g., voltage of the gate activation signal), C represents the cumulative capacitance along a gate line, and f represents a frequency, such as a clock frequency at which the display driving circuitry is operating (e.g., gate driver IC 104 and source driver IC 100). By way of example, f may be on the order of several kilohertz (Khz) in some embodiments. Thus, as indicated by Equation 2, a reduction in C, as provided by the present embodiments, also provides reduced power consumption in operation of the display 12 of the electronic device 10. This may be particularly beneficial when the device 10 is a portable device operating primarily on battery power.

Figure 22:
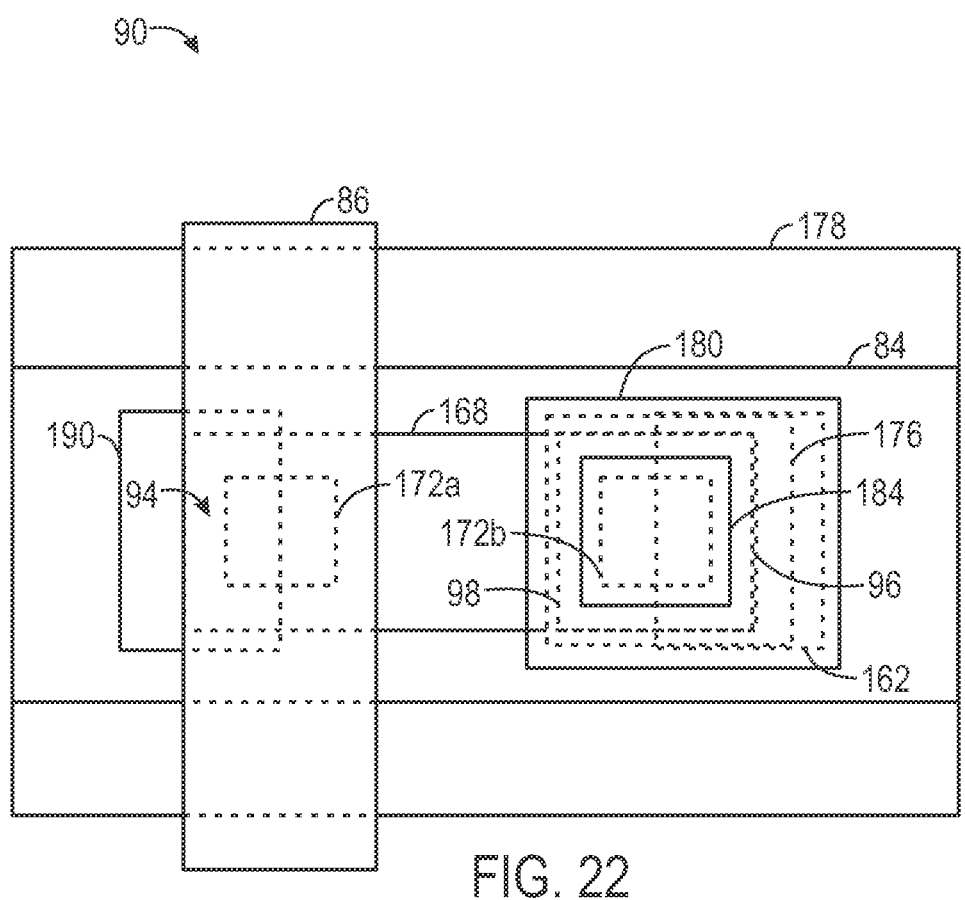
FIG. 22 is a partial top view of a metal oxide TFT, in accordance with a second embodiment of the present disclosure.
Figure 23:
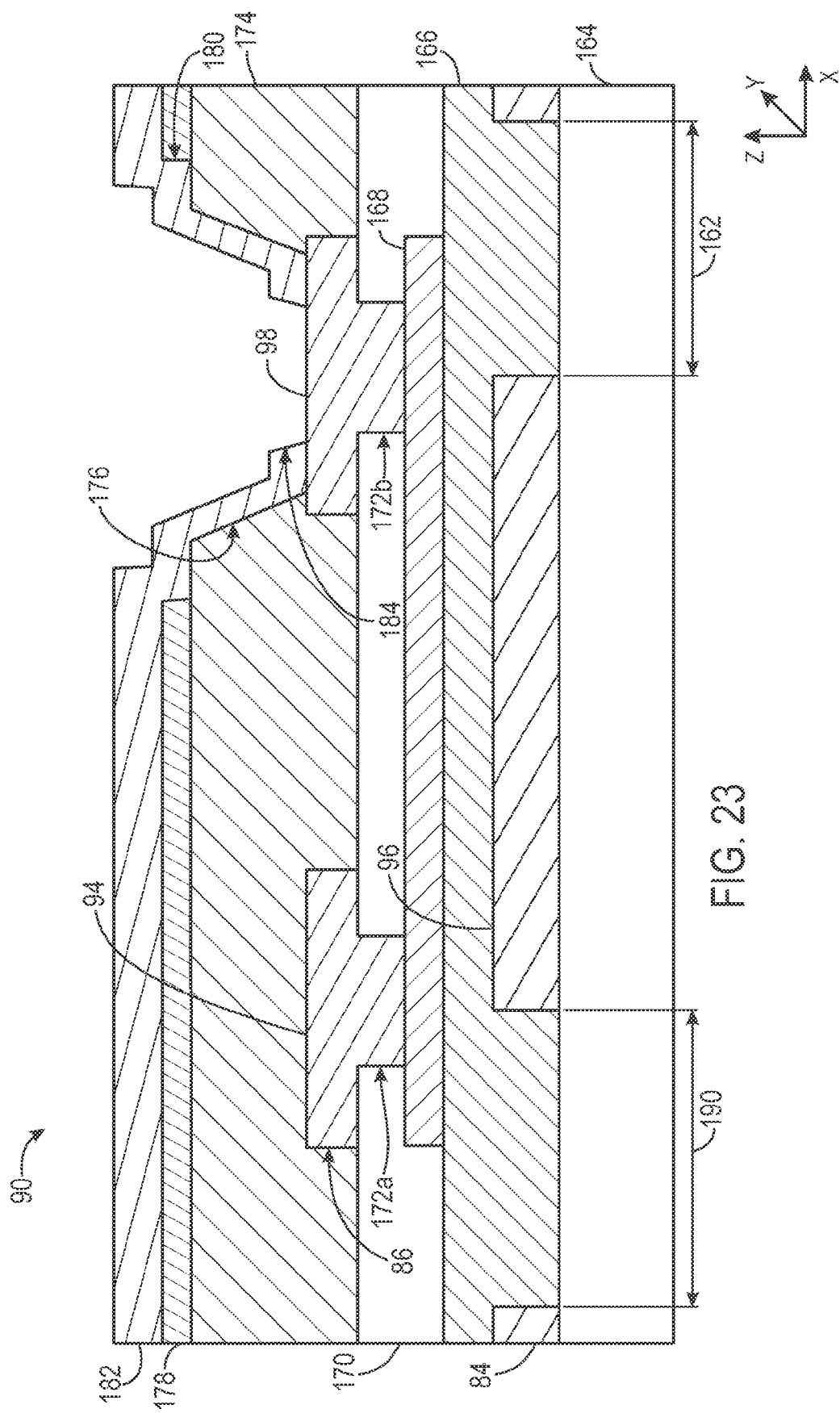
FIG. 23 is a cross sectional view of the metal oxide TFT of FIG. 22.

With these points in mind, FIGS. 22-23 illustrate another embodiment of the TFT 90. Specifically, FIG. 22 illustrates a partial top view of the TFT 90 and FIG. 23 illustrates a corresponding cross sectional view. The embodiment of the TFT 90 shown in FIGS. 22-23 is generally identical to the TFT 90 described above in FIGS. 11-12 with the addition of a second gate hole 190 disposed below the source 94 of the TFT 90, such that the source 94 at least partially overlaps the second gate hole 190. By the same principles discussed above with regard to the first gate hole 162, the present of the second gate hole 190 reduces the area of the region of the gate line 84 disposed below the source 94 of the TFT 90. Thus, the presence of the second gate hole may further reduce the parasitic capacitance between the gate line 84 and the source 94 and/or the gate line 84 and the Vcom electrode 178. Thus, when used alone or in conjunction with the gate hole 162 described above, the formation of the gate hole 190 may also decrease parasitic capacitance and RC loading of the gate line 84, thus improving panel performance by reducing the appearance of visual artifacts (e.g., image sticking and/or color shifts) and increasing color accuracy.

Figure 24:
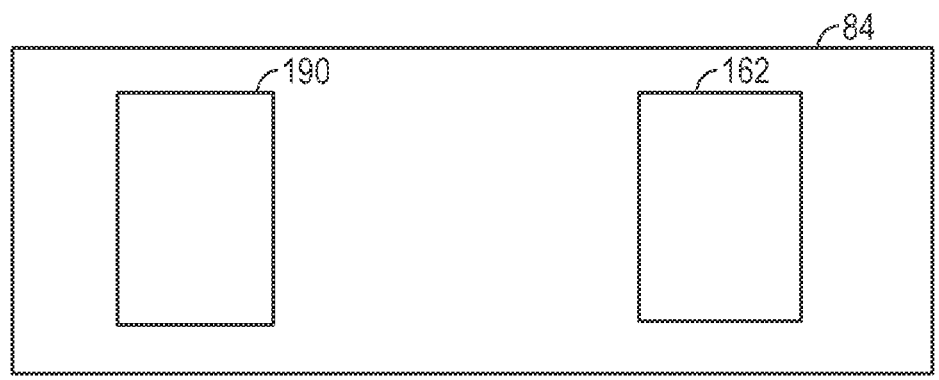
FIGS. 24-26 depict steps for fabricating the metal oxide TFT of FIG. 22.
Figure 25:
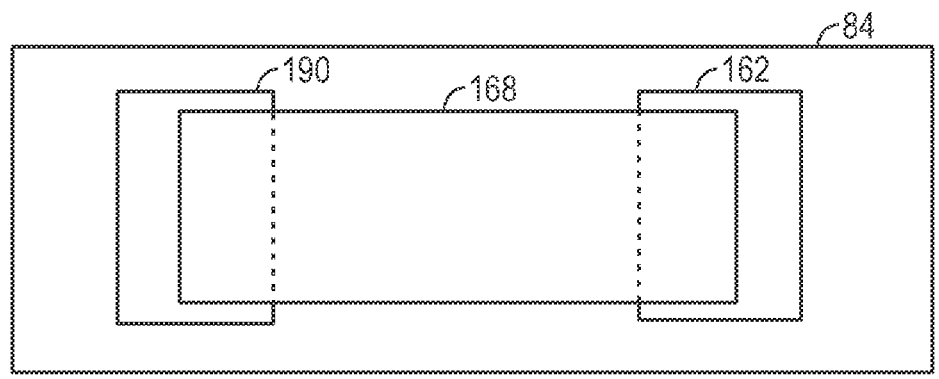
Figure 26:
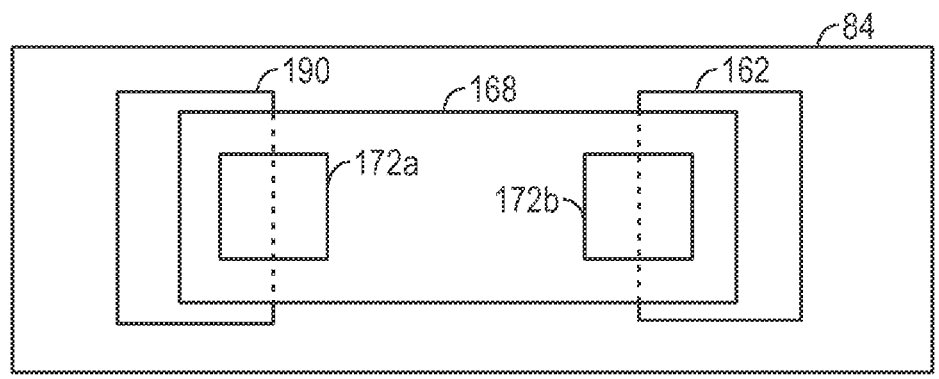

The fabrication of the TFT 90 in this embodiment is generally similar to the process described above with reference to the embodiment shown in FIGS. 11-19, except that the second gate hole 190 is formed at the same step as the formation of the first gate hole 162. For instance, referring to FIG. 24, after the formation of the gate line 84, the gate holes 162 and 190 are formed. A gate insulation layer 166 may be deposited over the gate line 84, and may fill the gate holes 162 and 190. As shown in FIG. 25, a metal oxide semiconductor 168 may then be deposited to form an active layer 168 for the TFT 90. Subsequently, FIG. 26 depicts the formation of an etch stopper layer 170 over the active layer 168, as well as the formation of the ES contact holes 172a and 172b. As can be appreciated, the remaining steps for fabricating the TFT 90 in this embodiment are generally identical to the steps discussed above with respect to the embodiment of FIGS. 11-19. Further, it should be understood that while the embodiment shown in FIGS. 22-23 depict the use of both gate holes 162 and 190, some embodiments of the TFT 90 may utilize only the gate hole 190 without the gate hole 162. With regard to the embodiments discussed above, the configuration of the pixel electrode 92 has utilized a middle-com structure. In other embodiments, a top-com structure be utilized, in which the pixel electrode may directly contact the metal oxide active layer to form an Ohmic contact.

Figure 27:
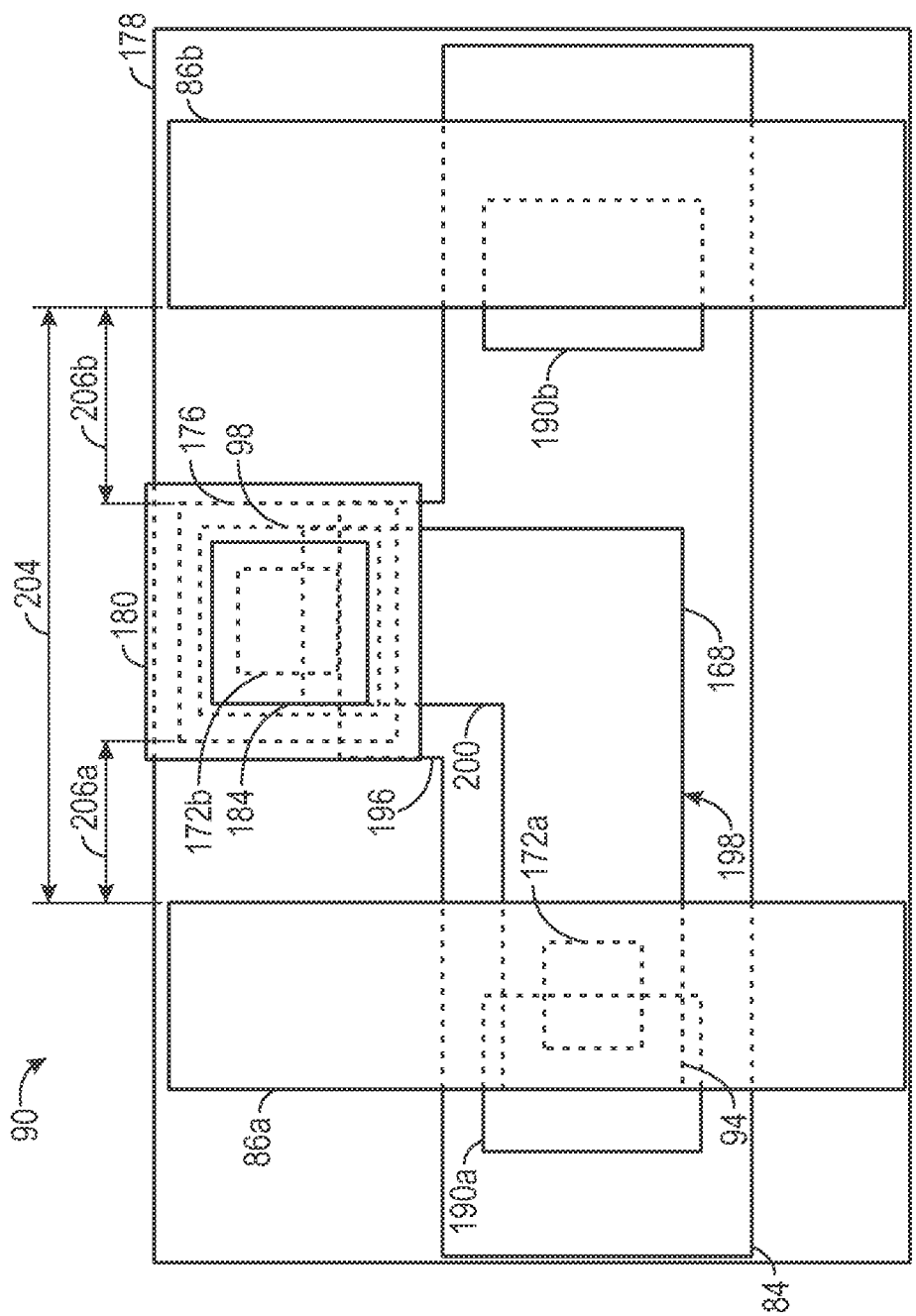
FIG. 27 is a partial top view of a metal oxide TFT, in accordance with a third embodiment of the present disclosure.

FIG. 27 depicts a further embodiment of the TFT 90 that may be implemented in the pixels 82 of the display panel 80 shown in FIG. 5. While the sequence of steps for fabricating the TFT 90 shown in FIG. 27 may be similar to the steps for fabricating the TFT 90 in the above-discussed embodiments, certain elements of the present embodiment have some structural differences. For instance, as shown in FIG. 27, for each pixel 82, the gate line 84 includes a protrusion 196 that extends perpendicularly away from the gate line 84. Further, while the source 94 of the TFT 90 is still formed at the intersection of the gate line 84 and the source line 86a, the drain 98 of the TFT 90 is formed towards the end of the protrusion 196. In this embodiment, the active layer 168 connecting the source 94 to the drain 98 has an "L-shaped" structure including a first portion 198 that is parallel to and disposed over the gate line 84 and a second portion 200 that is perpendicular to the first portion 198 and gate line 94 and disposed over the protrusion 196. This is in comparison the above-discussed embodiments of the TFT 90, wherein the entire structure of the active layer 168 was parallel to the gate line 84, i.e., an "I-shaped" structure. As can be appreciated, by forming the pixel contact hole 194 off of the gate line 84, the distance or pitch 204 between the data line 86a and its adjacent data line 86b may be reduced. This configuration may be particularly well-suited for high resolution displays (e.g., 300 or more pixels per inch), such as the Retina Display®, available from Apple Inc. As can be appreciated, the pitch 204 may depend on the display size and resolution (e.g., pixels per inch). In some embodiments, the pitch 204 may be between approximately 10 to 20 microns.

In the present embodiment, it is noted the protrusion 196 is only partially overlapped by the pixel contact hole 184, the ES contact hole 172a, the organic hole 176, and the Vcom hole 180. In other words, the protrusion 196 does not fully extend under the area of these hole structures. This produces an effect that is similar to the use of the gate hole 162 in that the reduction of the smaller area the gate line 84 in the region under drain 98 and pixel contact hole 184 reduces parasitic capacitance and improves RC loading.

As noted above, despite the structural differences, the fabrication steps for producing the TFT 90 shown in FIG. 27 are generally similar to the steps discussed above with respect to the embodiments shown in FIGS. 11-26. For example, to fabricate the TFT, the gate line 84 may be formed on a glass substrate. In this embodiment, the gate line 84 is formed to include the protrusion 196. Further, as shown, the gate hole 190a (and 190b for the adjacent TFT) may be formed in the gate line 84. Next, a gate insulating layer may be formed over the gate line, such that it fills the hole 190a (and 190b). Thereafter, the L-shaped metal oxide semiconductor is formed, thus defining the active layer 168 between a source and drain of the TFT 90.

Next, an etch stopper layer is deposited on top of the active layer 168, and the etch stopper contact holes 172a and 172b are formed, exposing a portion of the active layer 168. Conductive material is then deposited over the ES contact holes 172a and 172b to form the source 94 and drain 98 of the TFT 90. Subsequently, an organic layer (e.g., 174) is deposited over the source 94 and drain 98 and etched to form the organic hole 176. The common voltage (Vcom) electrode layer 178 is then deposited over the organic layer 174 followed by the formation of the Vcom hole 180. Finally, a passivation layer 182 (e.g., silicon nitride) is formed over the Vcom electrode layer 178, and a pixel contact hole 184 is formed in the passivation layer. As shown in FIG. 27, the location of the contact area (e.g., consisting of the various holes forming the pixel contact hole 184) of the TFT 90 is positioned at distances 206a and 206b from adjacent data lines 86a and 86b, respectively. In one embodiment, the distances 206a and 206b are equal. Further, the use of the L-shaped active layer 168 in this embodiment (e.g., with the protrusion 196) and the gate hole 190a may decrease parasitic capacitance and RC loading of the gate line 84 in a manner similar to the above-discussed embodiments, thus improving panel performance by reducing the appearance of certain visual artifacts (e.g., image sticking and/or color shifts) and increasing color accuracy, while also providing increased pixel densities.

Figure 28:
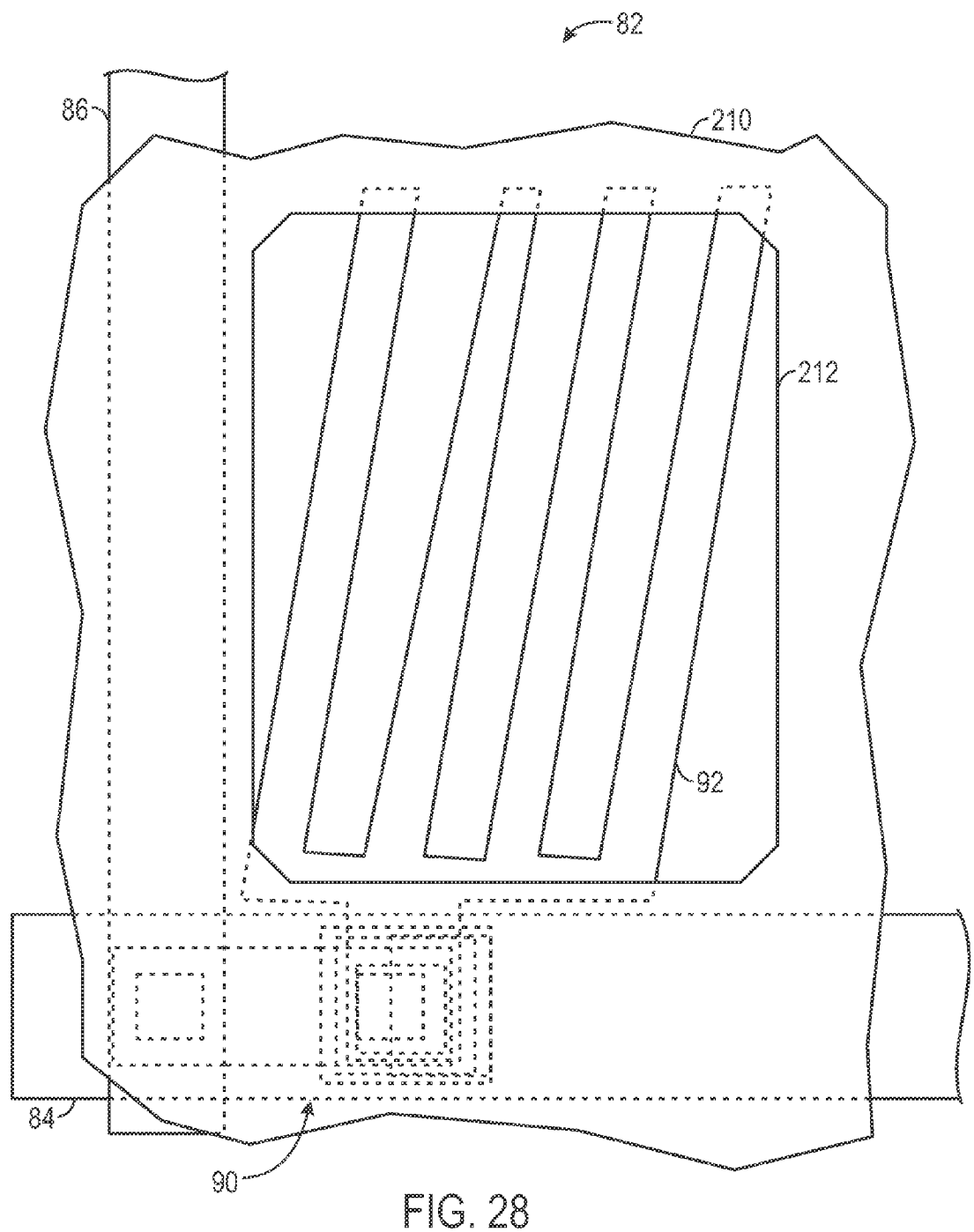
FIG. 28 depicts how transmittance of a display may be improved in accordance with aspects of the present disclosure.

As discussed above, the use of metal oxide semiconductors for the active layer 168 may allow for a reduction in the size of the TFT 90 when compared to conventional TFTs having active layers formed from silicon-based materials. The reduction in the size of the TFT 90 may also allow for a reduction in the width of the gate line 84. Accordingly, since an opaque black mask of a color filter array overlaying the LCD panel 80 is generally configured so that it masks or covers the TFTs, gate lines, and source lines, a reduction in the size of these components may allow for the dimensions and area of the black mask to be reduced, thus allowing for the aperture size over each unit pixel to be increased. Thus, the overall transmittance of the display 12 may increase due to the increased aperture sizes. By way of example only, in some embodiments utilizing the presently disclosed metal oxide TFTs, an increase of between approximately 5 to 20 percent in overall transmittance may be achieved when compared to a display utilizing the conventional TFTs 112 described above. This is illustrated in FIG. 28, which shows a portion of a black mask 210 of a color filter array covering a TFT 90, gate line 84, and source line 86, and defining an aperture 212 over the pixel 82. Because the size of the metal oxide TFT 90 may be smaller relative to silicon-based TFTs (e.g., a-Si or poly-Si), the area of the black mask 210 needed to cover or mask the TFT 90 may be less than that required to mask a similarly configured silicon-based TFT. Thus, the reduced area of the black mask 210 may result in increased size of the aperture 212, thereby increasing overall transmittance.

FIG. 29 illustrates yet another embodiment of the metal oxide TFT 90. The TFT 90 shown in FIG. 29 is generally identical to the TFT 90 of the embodiment shown in FIGS. 11-12, except that the passivation layer formed over the source 94 and drain 98 includes both an inorganic layer 220 and the organic layer 174. As can be appreciated, the formation of the gate line 84, the gate insulation layer 166, the metal oxide semiconductor active layer 168, the etch stopper layer 170 (with ES contact holes 172a and 172b), and the source 94 and drain 98 may be accomplished generally in the same manner discussed above with reference to FIG. 12. However, in the present embodiment, an inorganic layer 220 is formed prior to formation of the organic layer 174. For instance, the inorganic layer 220 may be formed using PVD or CVD processes. A hole 222 (inorganic hole) may be formed in the inorganic layer 220 over to expose a portion of the drain 98. Next, the organic layer 174 is formed, followed by formation of the organic hole 176, as discussed above in FIG. 12. The Vcom electrode layer 178 and the Vcom hole 180 may then be formed over the organic layer 174. Finally, the passivation layer 182 is formed over the Vcom electrode layer 178, followed by the formation of the pixel contact hole 184. In some embodiments, the inorganic hole 222 may not be formed immediately after depositing the inorganic layer 220 (e.g., prior to formation of the organic layer 174). For instance, in one embodiment the passivation layer 182, which may be made from silicon nitride, is formed such that it at least partially fills the Vcom hole 180 and the organic hole 176, and the pixel contact hole 184 and the inorganic hole 222 may be formed in a single etch step, such as by using an etchant that is selective to the material of both the inorganic layer 220 and the passivation layer 182. In one embodiment, the inorganic layer 220 and the passivation layer 182 may both be formed from the same material, such as silicon nitride ($SiN_X$). As can be appreciated, the inorganic layer 220 may also be provided in the embodiments of the TFT 90 shown in FIG. 23 and FIG. 27.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A method for manufacturing a thin-film transistor (TFT) for a display device, comprising:
   providing a substrate;
   forming a gate line over the substrate, wherein the gate line defines a gate for the TFT;
   forming at least one hole in the gate line, wherein forming the at least one hole comprises forming a first hole in a region of the gate line generally below where a drain of the TFT will be formed;
   forming a metal oxide active layer over the gate line;
   forming an etch stopper layer over the metal oxide active layer;
   forming a first hole and a second hole in the etch stopper layer;
   depositing conductive material over the first and second holes to form a source over first hole and a drain over the second hole;
   forming an organic passivation layer over the source and drain;
   etching a third hole in the organic passivation layer that exposes at least a portion of the drain;
   forming a common voltage electrode over the organic passivation layer and the exposed portion of the drain;
   etching a fourth hole in the common voltage electrode layer that exposes at least a portion of the organic passivation layer and the drain;
   forming a passivation layer over the common voltage electrode layer and the exposed portions of the organic passivation layer and the drain; and
   etching a fifth hole that exposes a portion of the drain;
   wherein the first hole is at least partially overlapped by the drain.

2. The method of claim 1, comprising forming a pixel electrode over the passivation layer, wherein the pixel electrode contacts the exposed portion of the drain through the fifth hole.

3. The method of claim 1, wherein forming the at least one hole comprises forming a second hole a region of the gate line generally below the source of the TFT, such that the second hole is at least partially overlapped by the source.

4. The method of claim 3, wherein each of the first and second holes formed in the gate line is configured to reduce parasitic capacitance between the gate line and components of the TFT.

5. The method of claim 1, comprising depositing a gate insulation layer over the gate line and before forming the metal oxide active layer.

6. A display device comprising:
   a liquid crystal display (LCD) panel comprising a plurality of display pixels arranged in rows and column, wherein each of the display pixels comprises:
   a pixel electrode; and
   a thin-film transistor (TFT) coupled to a source line and a gate line, wherein the gate line comprises a protrusion extending outwardly in a perpendicular direction, and wherein the TFT comprises:
   an L-shaped metal oxide active layer comprising a first portion that is parallel to the gate line and a second portion that is perpendicular to the gate line but parallel to the protrusion;
   a source formed only on the first portion of the L-shaped metal oxide active layer; and
   a drain formed only on the second portion of the L-shaped metal oxide active layer, wherein the protrusion is only partially overlapped by the drain.

7. The display device of claim 6, wherein the gate line comprises a hole formed in a region that is generally beneath the source, wherein the source at least partially overlaps the hole.

8. The display device of claim 6, comprising a pixel contact hole formed above the drain, wherein the pixel contact hole is located between a source line connected to the source of the TFT and an adjacent source line.

9. The display device of claim 8, wherein the distance of the pixel contact hole from each of the source line and the adjacent source line is equal.

10. A display device comprising:
    a liquid crystal display (LCD) panel comprising a plurality of display pixels arranged in rows and column, wherein each of the display pixels comprises:
    a pixel electrode; and
    a thin-film transistor (TFT) coupled to a source line and a gate line, wherein the TFT comprises:
    a substrate;
    a gate coupled to the gate line, wherein the gate line is formed over the substrate and the gate line comprises a first hole in a region generally below a drain of the TFT;
    a metal oxide active layer formed over the gate line;
    an etch stop layer formed over the metal oxide active layer, wherein the etch stop layer comprises a first hole and a second hole;
    a source coupled to the source line, wherein the source comprises a conductive material formed over the first hole in the etch stop layer;
    the drain comprising the conductive material formed over the second hole in etch stop layer;
    an organic passivation layer formed over the source and the drain, wherein the passivation layer comprises a third hole that exposes at least a portion of the drain;
    a common voltage electrode formed over the organic passivation layer, wherein the common voltage electrode comprises a fourth hole that exposes at least a portion of the organic passivation layer and the drain;
    a passivation layer formed over the common voltage electrode layer and the exposed portions of the organic passivation layer and the drain, wherein the passivation layer comprises a fifth hole that exposes a portion the drain to be coupled to the pixel electrode;

wherein the first hole is at least partially overlapped by the drain.

11. The display device of claim 10, wherein the TFT comprises a channel comprising the metal oxide active layer.

12. The display device of claim 10, wherein the reduction in parasitic capacitance decreases loading in the gate line.

13. The display device of claim 10, wherein the gate line comprises a second hole formed at least partially beneath the source of the TFT, wherein the source at least partially overlaps the second hole.

\* \* \* \* \*